(12) United States Patent
Melanson et al.

(10) Patent No.: US 9,735,671 B2
(45) Date of Patent: Aug. 15, 2017

(54) CHARGE PUMP-BASED DRIVE CIRCUITRY FOR BIPOLAR JUNCTION TRANSISTOR (BJT)-BASED POWER SUPPLY

(71) Applicant: Cirrus Logic, Inc., Austin, TX (US)

(72) Inventors: John L. Melanson, Austin, TX (US); Ramin Zanbaghi, Austin, TX (US); Jieyeon Choi, Austin, TX (US); Firas Azrai, Austin, TX (US); Rahul Singh, Austin, TX (US); Siddharth Maru, Austin, TX (US)

(73) Assignee: CIRRUS LOGIC, INC., Austin, TX (US)

( * ) Notice: Subject to any disclaimer, the term of this patent is extended or adjusted under 35 U.S.C. 154(b) by 0 days.

(21) Appl. No.: 14/280,539

(22) Filed: May 16, 2014

(65) Prior Publication Data

US 2014/0339999 A1    Nov. 20, 2014

Related U.S. Application Data

(60) Provisional application No. 61/825,266, filed on May 20, 2013, provisional application No. 61/825,275, (Continued)

(51) Int. Cl.
*H05B 33/08* (2006.01)
*H02M 3/07* (2006.01)
(Continued)

(52) U.S. Cl.
CPC ............... *H02M 3/07* (2013.01); *H02M 1/08* (2013.01); *H03K 17/64* (2013.01); (Continued)

(58) Field of Classification Search
CPC ............ H05B 33/0815; H05B 33/0818; H05B 37/029; H05B 37/02; H05B 41/3925; H05B 41/391; H05B 41/2828; H05B 33/0803
(Continued)

(56) References Cited

U.S. PATENT DOCUMENTS 3,660,751 A    5/1972    Bullinga
3,790,878 A    2/1974    Brokaw
(Continued)

FOREIGN PATENT DOCUMENTS

EP    0536535 A1    4/1993
EP    0636889 A1    2/1995
(Continued)

OTHER PUBLICATIONS

International Search Report and Written Opinion mailed Sep. 18, 2014, during examination of PCT/US2014/038490, cited references previously disclosed on Sep. 29, 2014.
(Continued)

*Primary Examiner* — Douglas W Owens
*Assistant Examiner* — Syed M Kaiser
(74) *Attorney, Agent, or Firm* — Norton Rose Fulbright US LLP

(57) ABSTRACT

A bipolar junction transistor (BJT) may be used to generate a supply voltage for operating a controller, such as a lighting controller for a LED-based light bulb. A base of the BJT may receive current generated from the supply voltage to control operation of the BJT. Although the base of the BJT would be at a lower voltage than the emitter, a base drive circuit may be coupled between the emitter and the base of the BJT to increase the voltage. As one example, the base drive circuit may be a charge pump. In another example, the BJT may function as its own charge pump. In yet another example, a
(Continued)

positive and a negative base current of the BJT may be independently controlled to regulate an output supply voltage $V_{DD}$ from the BJT.

29 Claims, 14 Drawing Sheets

Related U.S. Application Data filed on May 20, 2013, provisional application No. 61/824,725, filed on May 17, 2013.

(51) Int. Cl.
*H02M 1/08* (2006.01)
*H03K 17/64* (2006.01)
*H02M 3/335* (2006.01)
*H02M 1/00* (2006.01)

(52) U.S. Cl.
CPC ..... *H05B 33/0815* (2013.01); *H05B 33/0845* (2013.01); *H02M 3/335* (2013.01); *H02M 2001/0006* (2013.01)

(58) Field of Classification Search
USPC .......... 315/291, 193, 308, 307; 363/59; 323/282
See application file for complete search history.

(56) References Cited

U.S. PATENT DOCUMENTS

| | | |
|---|---|---|
| 4,322,785 A | 3/1982 | Walker |
| 4,339,671 A | 7/1982 | Park et al. |
| 4,342,956 A | 8/1982 | Archer |
| 4,399,500 A | 8/1983 | Clarke et al. |
| 4,410,810 A | 10/1983 | Christen |
| 4,493,017 A | 1/1985 | Kammiller et al. |
| 4,585,986 A | 4/1986 | Dyer |
| 4,629,971 A | 12/1986 | Kirk |
| 4,675,547 A | 6/1987 | Eichenwald |
| 4,677,366 A | 6/1987 | Wilkinson et al. |
| 4,683,529 A | 7/1987 | Bucher, II |
| 4,737,658 A | 4/1988 | Kronmuller et al. |
| 4,739,462 A | 4/1988 | Farnsworth et al. |
| 4,937,728 A | 6/1990 | Leonardi |
| 4,940,929 A | 7/1990 | Williams |
| 4,970,635 A | 11/1990 | Shekhawat et al. |
| 4,977,366 A | 12/1990 | Powell |
| 5,001,620 A | 3/1991 | Smith |
| 5,003,454 A | 3/1991 | Bruning |
| 5,055,746 A | 10/1991 | Hu et al. |
| 5,109,185 A | 4/1992 | Ball |
| 5,173,643 A | 12/1992 | Sullivan et al. |
| 5,264,780 A | 11/1993 | Bruer et al. |
| 5,278,490 A | 1/1994 | Smedley |
| 5,383,109 A | 1/1995 | Maksimovic et al. |
| 5,424,665 A | 6/1995 | Sueri et al. |
| 5,424,932 A | 6/1995 | Inou et al. |
| 5,430,635 A | 7/1995 | Liu |
| 5,479,333 A | 12/1995 | McCambridge et al. |
| 5,481,178 A | 1/1996 | Wilcox et al. |
| 5,486,781 A | 1/1996 | Im |
| 5,565,761 A | 10/1996 | Hwang |
| 5,638,265 A | 6/1997 | Gabor |
| 5,691,890 A | 11/1997 | Hyde |
| 5,747,977 A | 5/1998 | Hwang |
| 5,757,635 A | 5/1998 | Seong |
| 5,764,039 A | 6/1998 | Choi et al. |
| 5,783,909 A | 7/1998 | Hochstein |
| 5,798,635 A | 8/1998 | Hwang et al. |
| 5,808,453 A | 9/1998 | Lee et al. |
| 5,874,725 A | 2/1999 | Yamaguchi |
| 5,960,207 A | 9/1999 | Brown |
| 5,994,885 A | 11/1999 | Wilcox et al. |
| 6,043,633 A | 3/2000 | Lev et al. |
| 6,084,450 A | 7/2000 | Smith et al. |
| 6,091,233 A | 7/2000 | Hwang et al. |
| 6,160,724 A | 12/2000 | Hemena et al. |
| 6,229,292 B1 | 5/2001 | Redl et al. |
| 6,259,614 B1 | 7/2001 | Ribarich et al. |
| 6,300,723 B1 | 10/2001 | Wang et al. |
| 6,304,066 B1 | 10/2001 | Wilcox et al. |
| 6,304,473 B1 | 10/2001 | Telefus et al. |
| 6,343,026 B1 | 1/2002 | Perry |
| 6,356,040 B1 | 3/2002 | Preis et al. |
| 6,445,600 B2 | 9/2002 | Ben-Yaakov |
| 6,469,484 B2 | 10/2002 | L'Hermite et al. |
| 6,510,995 B2 | 1/2003 | Muthu et al. |
| 6,531,854 B2 | 3/2003 | Hwang |
| 6,580,258 B2 | 6/2003 | Wilcox et al. |
| 6,583,550 B2 | 6/2003 | Iwasa et al. |
| 6,628,106 B1 | 9/2003 | Batarseh et al. |
| 6,657,417 B1 | 12/2003 | Hwang |
| 6,661,182 B2 | 12/2003 | Sridharan |
| 6,696,803 B2 | 2/2004 | Tao et al. |
| 6,724,174 B1 | 4/2004 | Esteves et al. |
| 6,758,199 B2 | 7/2004 | Masters et al. |
| 6,768,655 B1 | 7/2004 | Yang et al. |
| 6,781,351 B2 | 8/2004 | Mednik et al. |
| 6,839,247 B1 | 1/2005 | Yang et al. |
| 6,882,552 B2 | 4/2005 | Telefus et al. |
| 6,894,471 B2 | 5/2005 | Corva et al. |
| 6,933,706 B2 | 8/2005 | Shih |
| 6,940,733 B2 | 9/2005 | Schie et al. |
| 6,944,034 B1 | 9/2005 | Shteynberg et al. |
| 6,956,750 B1 | 10/2005 | Eason et al. |
| 6,975,523 B2 | 12/2005 | Kim et al. |
| 6,980,446 B2 | 12/2005 | Simada et al. |
| 7,042,161 B1 | 5/2006 | Konopka |
| 7,072,191 B2 | 7/2006 | Nakao et al. |
| 7,099,163 B1 | 8/2006 | Ying |
| 7,161,816 B2 | 1/2007 | Shteynberg et al. |
| 7,221,130 B2 | 5/2007 | Ribeiro et al. |
| 7,224,206 B2 | 5/2007 | Pappalardo et al. |
| 7,233,135 B2 | 6/2007 | Noma et al. |
| 7,266,001 B1 | 9/2007 | Notohamiprodjo et al. |
| 7,292,013 B1 | 11/2007 | Chen et al. |
| 7,295,452 B1 | 11/2007 | Liu |
| 7,411,379 B2 | 8/2008 | Chu et al. |
| 7,414,371 B1 | 8/2008 | Choi et al. |
| 7,439,810 B2 | 10/2008 | Manicone et al. |
| 7,449,841 B2 | 11/2008 | Ball |
| 7,554,473 B2 | 6/2009 | Melanson |
| 7,567,091 B2 | 7/2009 | Farnworth et al. |
| 7,606,532 B2 | 10/2009 | Wuidart |
| 7,667,986 B2 | 2/2010 | Artusi et al. |
| 7,684,223 B2 | 3/2010 | Wei |
| 7,719,246 B2 | 5/2010 | Melanson |
| 7,719,248 B1 | 5/2010 | Melanson |
| 7,746,043 B2 | 6/2010 | Melanson |
| 7,804,480 B2 | 9/2010 | Jeon et al. |
| 7,834,553 B2 | 11/2010 | Hunt et al. |
| 7,859,488 B2 | 12/2010 | Kimura |
| 7,872,883 B1 | 1/2011 | Elbanhawy |
| 7,894,216 B2 | 2/2011 | Melanson |
| 8,008,898 B2 | 8/2011 | Melanson et al. |
| 8,169,806 B2 | 5/2012 | Sims et al. |
| 8,193,717 B2 | 6/2012 | Leiderman |
| 8,222,772 B1 | 7/2012 | Vinciarelli |
| 8,242,764 B2 | 8/2012 | Shimizu et al. |
| 8,248,145 B2 | 8/2012 | Melanson |
| 8,369,109 B2 | 2/2013 | Niedermeier et al. |
| 8,441,220 B2 | 5/2013 | Imura |
| 8,536,799 B1 | 9/2013 | Grisamore et al. |
| 8,610,364 B2 | 12/2013 | Melanson et al. |
| 2002/0082056 A1 | 6/2002 | Mandai et al. |
| 2002/0171467 A1* | 11/2002 | Worley et al. ............ 327/514 |
| 2003/0090252 A1 | 5/2003 | Hazucha |
| 2003/0111969 A1 | 6/2003 | Konishi et al. |
| 2003/0160576 A1 | 8/2003 | Suzuki |
| 2003/0174520 A1 | 9/2003 | Bimbaud |
| 2003/0214821 A1 | 11/2003 | Giannopoulos et al. |
| 2003/0223255 A1 | 12/2003 | Ben-Yaakov et al. |

(56) References Cited

U.S. PATENT DOCUMENTS

| | | | |
|---|---|---|---|
| 2004/0046683 | A1 | 3/2004 | Mitamura et al. |
| 2004/0196672 | A1 | 10/2004 | Amei |
| 2005/0057237 | A1 | 3/2005 | Clavel |
| 2005/0207190 | A1 | 9/2005 | Gritter |
| 2005/0231183 | A1 | 10/2005 | Li et al. |
| 2005/0270813 | A1 | 12/2005 | Zhang et al. |
| 2005/0275354 | A1 | 12/2005 | Hausman et al. |
| 2006/0013026 | A1 | 1/2006 | Frank et al. |
| 2006/0022648 | A1 | 2/2006 | Ben-Yaakov et al. |
| 2006/0214603 | A1 | 9/2006 | Oh et al. |
| 2007/0103949 | A1 | 5/2007 | Tsuruya |
| 2007/0120506 | A1* | 5/2007 | Grant .......................... 315/312 |
| 2007/0182347 | A1 | 8/2007 | Shteynberg et al. |
| 2008/0018261 | A1 | 1/2008 | Kastner |
| 2008/0043504 | A1 | 2/2008 | Ye et al. |
| 2008/0062584 | A1 | 3/2008 | Freitag et al. |
| 2008/0062586 | A1 | 3/2008 | Apfel |
| 2008/0117656 | A1 | 5/2008 | Clarkin |
| 2008/0130336 | A1 | 6/2008 | Taguchi |
| 2008/0175029 | A1 | 7/2008 | Jung et al. |
| 2008/0259655 | A1 | 10/2008 | Wei et al. |
| 2008/0278132 | A1 | 11/2008 | Kesterson et al. |
| 2008/0310194 | A1 | 12/2008 | Huang et al. |
| 2009/0040796 | A1* | 2/2009 | Lalithambika et al. ... 363/21.17 |
| 2009/0059632 | A1 | 3/2009 | Li et al. |
| 2009/0067204 | A1 | 3/2009 | Ye et al. |
| 2009/0108677 | A1 | 4/2009 | Walter et al. |
| 2009/0184665 | A1 | 7/2009 | Ferro |
| 2009/0295300 | A1 | 12/2009 | King |
| 2010/0110682 | A1* | 5/2010 | Jung et al. ............... 362/249.02 |
| 2010/0128501 | A1 | 5/2010 | Huang et al. |
| 2010/0202165 | A1 | 8/2010 | Zheng et al. |
| 2010/0238689 | A1 | 9/2010 | Fei et al. |
| 2010/0244793 | A1 | 9/2010 | Caldwell |
| 2011/0110132 | A1 | 5/2011 | Rausch et al. |
| 2011/0199793 | A1 | 8/2011 | Kuang et al. |
| 2011/0276938 | A1 | 11/2011 | Perry et al. |
| 2011/0291583 | A1 | 12/2011 | Shen |
| 2011/0298442 | A1 | 12/2011 | Waltisperger et al. |
| 2011/0309760 | A1 | 12/2011 | Beland et al. |
| 2012/0062131 | A1 | 3/2012 | Choi et al. |
| 2012/0146540 | A1 | 6/2012 | Khayat et al. |
| 2012/0158188 | A1* | 6/2012 | Madala .......................... 700/276 |
| 2012/0161857 | A1* | 6/2012 | Sakaguchi .................... 327/536 |
| 2012/0182003 | A1 | 7/2012 | Flaibani et al. |
| 2012/0187997 | A1 | 7/2012 | Liao et al. |
| 2012/0248998 | A1 | 10/2012 | Yoshinaga |
| 2012/0286843 | A1 | 11/2012 | Kurokawa |
| 2012/0313598 | A1* | 12/2012 | Arp .............................. 323/282 |
| 2012/0320640 | A1 | 12/2012 | Baurle et al. |
| 2013/0088902 | A1 | 4/2013 | Dunipace |
| 2013/0107595 | A1 | 5/2013 | Gautier et al. |
| 2013/0181635 | A1 | 7/2013 | Ling |
| 2013/0293135 | A1* | 11/2013 | Hu et al. ....................... 315/224 |
| 2014/0218978 | A1 | 8/2014 | Heuken et al. |

FOREIGN PATENT DOCUMENTS

| | | | |
|---|---|---|---|
| EP | 1213823 | A2 | 6/2002 |
| EP | 1289107 | A2 | 3/2003 |
| EP | 1962263 | A2 | 8/2008 |
| EP | 2232949 | A2 | 9/2010 |
| EP | 2257127 | A1 | 12/2010 |
| JP | 2008053181 | A | 3/2008 |
| WO | 01/84697 | A2 | 11/2001 |
| WO | 2004051834 | A1 | 6/2004 |
| WO | 2006013557 | A2 | 2/2006 |
| WO | 2006/022107 | A1 | 3/2006 |
| WO | 2007016373 | A2 | 2/2007 |
| WO | 2008004008 | A2 | 1/2008 |
| WO | 2008152838 | A1 | 12/2008 |
| WO | 2010011971 | A1 | 1/2010 |
| WO | 2010065598 | A2 | 6/2010 |
| WO | 2011008635 | A1 | 1/2011 |

OTHER PUBLICATIONS

International Search Report and Written Opinion mailed Sep. 16, 2014, during examination of PCT/US2014/038507, cited references previously disclosed on Sep. 29, 2014.
Severns, A New Improved and Simplified Proportional Base Drive Circuit, Proceedings of PowerCon 6, May 1979.
Ivanovic, Zelimir, "A low consumption proportional base drive circuit design for switching transistors", Proceedings of The Fifth International PCI '82 Conference: Sep. 28-30, 1982, Geneva, Switzerland.
Bell, David, "Designing optimal base drive for high voltage switching transistors", Proceeding of PowerCon7, 1980.
Marcelo Godoy Simões, "Power Bipolar Transistors", Chapter 5, Academic Press 2001, pp. 63-74.
Varga, L.D. and Losic, N.A., "Design of a high-performance floating power BJT driver with proportional base drive," Industry Applications Society Annual Meeting, 1989., Conference Record of the Oct. 1-5, 1989, IEEE, vol. I, pp. I186, 1189.
Skanadore, W.R., "Toward an understanding and optimal utilization of third-generation bipolar switching transistors", 1982 IEEE.
IC datasheet STR-S6707 through STR-S6709 by Sanken, copyright 1994, Allegro MicroSystems, Inc.
Avant et al., "Analysis of magnetic proportional drive circuits for bipolar junction transistors" PESC 1985, pp. 375-381.
Maksimovic, et al, Impact of Digital Control in Power Electronics, International Symposium on Power Semiconductor Devices and ICS, 2004, pp. 2-22, Boulder, Colorado, USA.
Fairchild Semiconductor, Ballast Control IC, FAN 7711, Rev. 1.0.3, 2007, pp. 1-23, San Jose, California, USA.
Yao, Gang et al, Soft Switching Circuit for Interleaved Boost Converters, IEEE Transactions on Power Electronics, vol. 22, No. 1, Jan. 2007, pp. 1-8, Hangzhou China.
Stmicroelectronics, Transition Mode PFC Controller, Datasheet L6562, Rev. 8, Nov. 2005, pp. 1-16, Geneva, Switzerland.
Zhang, Wanfeng et al, A New Duty Cycle Control Strategy for Power Factor Correction and FPGA Implementation, IEEE Transactions on Power Electronics, vol. 21, No. 6, Nov. 2006, pp. 1-10, Kingston, Ontario, Canada.
Stmicroelectronics, Power Factor Connector L6561, Rev 16, Jun. 2004, pp. 1-13, Geneva, Switzerland.
Texas Instruments, Avoiding Audible Noise at Light Loads When Using Leading Edge Triggered PFC Converters, Application Report SLUA309A, Mar. 2004-Revised Sep. 2004, pp. 1-4, Dallas, Texas, USA.
Texas Instruments, Startup Current Transient of the Leading Edge Triggered PFC Controllers, Application Report SLUA321, Jul. 2004, pp. 1-4, Dallas, Texas, USA.
Texas Instruments, Current Sense Transformer Evaluation UCC3817, Application Report SLUA308, Feb. 2004, pp. 1-3, Dallas, Texas, USA.
Texas Instruments, BiCMOS Power Factor Preregulator Evaluation Board UCC3817, User's Guide, SLUU077C, Sep. 2000-Revised Nov. 2002, pp. 1-10, Dallas, Texas, USA.
Texas Instruments, Interleaving Continuous Conduction Mode PFC Controller, UCC28070, SLUS794C, Nov. 2007—Revised Jun. 2009, pp. 1-45, Dallas, Texas, USA.
Texas Instruments, 350-W Two-Phase Interleaved PFC Pre-regulator Design Review, Application Report SLUA369B, Feb. 2005—Revised Mar. 2007, pp. 1-22, Dallas, Texas, USA.
Texas Instruments, Average Current Mode Controlled Power Factor Correction Converter using TMS320LF2407A, Application Report SPRA902A, Jul. 2005, pp. 1-15, Dallas, Texas, USA.
Texas Instruments, Transition Mode PFC Controller, UCC28050, UCC28051, UCC38050, UCC38051, Application Note SLUS515D, Sep. 2002—Revised Jul. 2005, pp. 1-28, Dallas, Texas, USA.
Unitrode, High Power-Factor Preregulator, UC1852, UC2852, UC3852, Feb. 5, 2007, pp. 1-8, Merrimack, Maine, USA.
Unitrode, Optimizing Performance in UC3854 Power Factor Correction Applications, Design Note ON 39E, 1999, pp. 1-6, Merrimack, Maine, USA.

(56) References Cited

OTHER PUBLICATIONS

ON Semiconductor Four Key Steps to Design a Continuous Conduction Mode PFC Stage Using the NCP1653, Application Note AND8184/D, Nov. 2004, pp. 1-8, Phoenix, AZ, USA.
Unitrode, BiCMOS Power Factor Preregulator, Texas Instruments, UCC2817, UCC2818, UCC3817, UCC3818, SLUS3951, Feb. 2000—Revised Feb. 2006, pp. 1-25, Dallas, Texas, USA.
Unitrode, UC3854AIB and UC3855A!B Provide Power Limiting with Sinusoidal Input Current for PFC Front Ends, SLUA196A, Design Note DN-66, Jun. 1995—Revised Nov. 2001, pp. 1-6, Merrimack, Maine, USA.
Unitrode, Programmable Output Power Factor Preregulator, UCC2819, UCC3819, SLUS482B, Apr. 2001—Revised Dec. 2004, pp. 1-16, Merrimack, Maine, USA.
Texas Instruments, UCC281019, 8-Pin Continuous Conduction Mode (CCM) PFC Controller, SLU828B, Revised Apr. 2009, pp. 1-48, Dallas, Texas, USA.
http://toolbarpdf.com/docs/functions-and-features-of=inverters.html, Jan. 20, 2011, pp. 1-8.
Zhou, Jinghai, et al, Novel Sampling Algorithm for DSP Controlled 2kW PFC Converter, IEEE Transactions on Power Electronics, vol. 16, No. 2, Mar. 2001, pp. 1-6, Hangzhou, China.
Mammano, Bob, Current Sensing Solutions for Power Supply Designers, Texas Instruments, 2001, pp. 1-36, Dallas, Texas, USA.
Fairchild Semiconductor, Ballast Control IC FAN7532, Rev. 1.0.3, Jun. 2006, pp. 1-16, San Jose, California, USA.
Fairchild Semiconductor, Simple Ballast Controller, FAN7544, Rev. 1.0.0, Sep. 21, 2004, pp. 1-14, San Jose, California, USA.
Texas Instruments, High Performance Power Factor Preregulator, UC2855A/B and UC3855A/B, SLUS328B, Jun. 1998, Revised Oct. 2005, pp. 1-14, Dallas, TX, USA.
Balogh, Laszlo, et al, Power-Factor Correction with Interleaved Boost Converters in Continuous-Inductr-Current Mode, 1993, IEEE, pp. 168-174, Switzerland.
Cheng, Hung L., et al, A Novel Single-Stage High-Power-Factor Electronic Ballast with Symmetrical Topology, Power Electronics and Motion Control Conference, 2006. IPEMC 2006. CES/IEEE 5th International, Aug. 14-16, 2006, vol. 50, No. 4, Aug. 2003, pp. 759-766, Nat. Ilan Univ., Taiwan.
Fairchild Semiconductor. Theory and Application of the ML4821 Average Current Mode PFC Controllerr, Fairchild Semiconductor Application Note 42030. Rev. 1.0, Oct. 25, 2000, pp. 1-19, San Jose, California, USA.
Garcia, 0., et al, High Efficiency PFC Converter to Meet EN610000302 and A14, Industrial Electronics, 2002. ISIE 2002. Proceedings of the 2002 IEEE International Symposium, vol. 3, pp. 975-980, Div. de Ingenieria Electronica, Univ. Politecnica de Madrid, Spain.
Infineon Technologies AG, Standalone Power Factor Correction (PFC) Controller in Continuous Conduction Mode (CCM), Infineon Power Management and Supply, CCM-PFC, ICE2PCS01, ICE2PCS01 G, Version 2.1, Feb. 6, 2007, p. 1-22, Munchen, Germany.
Lu, et al, Bridgeless PFC Implementation Using One Cycle Control Technique, International Rectifier, 2005, pp. 1-6, Blacksburg, VA, USA.
Brown, et al, PFC Converter Design with IR1150 One Cycle Control IC, International Rectifier, Application Note AN-1 077, pp. 1-18, El Segundo CA, USA.
International Rectifer, PFC One Cycle Control PFC IC, International Rectifier, Data Sheet No. PD60230 rev. C, IR1150(S)(PbF), IR11501(S)(PbF), Feb. 5, 2007, pp. 1-16, El Segundo, CA, USA.
International Rectifier, IRAC1150=300W Demo Board, User's Guide, Rev 3.0, International Rectifier Computing and Communications SBU- AC-DC Application Group, pp. 1-18, Aug. 2, 2005, El Segundo, CO USA.
Lai, Z., et al, A Family of Power-Factor-Correction Controller, Applied Power Electronics Conference and Exposition, 1997. APEC '97 Conference Proceedings 1997., Twelfth Annual, vol. 1, pp. 66-73, Feb. 23-27, 1997, Irvine, CA.

Supertex, Inc., HV9931 Unity Power Factor Led Lamp Driver, Supertex, Inc., Application Note AN-H52, 2007, pp. 1-20, Sunnyvale, CA, USA.
Ben-Yaakov, et al, The Dynamics of a PWM Boost Converter with Resistive Input, IEEE Transactions on Industrial Electronics, vol. 46., No. 3, Jun. 1999, pp. 1-8, Negev, Beer-Sheva, Israel.
Erickson, Robert W., et al, Fundamentals of Power Electronics, Second Edition, Chapter 6, 2001, pp. 131-184, Boulder CO, USA.
Stmicroelectronics, CFL/TL Ballast Driver Preheat and Dimming L6574, Sep. 2003, pp. 1-10, Geneva, Switzerland.
Fairchild Semiconductor, 500W Power-Factor-Corrected (PFC) Converter Design with FAN4810, Application Note 6004, Rev. 1.0.1, Oct. 31, 2003, pp. 1-14, San Jose, CA, USA.
Fairfield Semiconductor, Power Factor Correction (PFC) Basics, Application Note 42047, Rev. 0.9.0, Aug. 19, 2004, pp. 1-11, San Jose, CA, USA.
Fairchild Semiconductor, Design of Power Factor Correction Circuit Using FAN7527B, Application Note AN4121, Rev. 1.0.1, May 30, 2002, pp. 1-12, San Jose, CA, USA.
Fairchild Semiconductor, Low Start-Up Current PFC/PWM Controller Combos FAN4800, Rev. 1.0.6, Nov. 2006, pp. 1-20, San Jose, CA, USA.
Prodic, Aleksander, Compensator Design and Stability Assessment for Fast Voltage Loops of Power Factor Correction Rectifiers, IEEE Transactions on Power Electronics, vol. 22, Issue 5, Sep. 2007, pp. 1719-1730, Toronto, Canada.
Fairchild Semiconductor, Z Average Current PFC Controller FAN 4822, Rev. 1.0.1, Aug. 10, 2001, pp. 1-10, San Jose, CA, USA.
Prodic, et al, Dead-Zone Digital Controller for Improved Dynamic Response of Power Factor Preregulators, Applied Power Electronics Conference and Exposition, 2003, vol. 1, pp. 382-388, Boulder CA, USA.
Philips Semiconductors, 90W Resonant SMPS with TEA 1610 Swing Chip, Application Note AN99011, Sep. 14, 1999, pp. 1-28, The Netherlands.
Fairchild Semiconductor, Power Factor Correction Controller FAN7527B, Aug. 16, 2003, pp. 1-12, San Jose, CA, USA.
ON Semiconductor, Power Factor Controller for Compact and Robust, Continuous Conduction Mode Pre-Converters, NCP1654, Mar. 2007, Rev. PO, pp. 1-10, Denver, CO, USA.
Fairchild Semicondctor, Simple Ballast Controller, KA7541, Rev. 1.0.3, Sep. 27, 2001, pp. 1-14, San Jose, CA, USA.
Fairchild Semiconductor, Power Factor Controller, ML4812, Rev. 1.0.4, May 31, 2001, pp. 1-18, San Jose, CA, USA.
Prodic, et al, Digital Controller for High-Frequency Rectifiers with Power Factor Correction Suitable for ON-Chip Implementation, Power Conversion Conference-Nagoya, 2007. PCC '07, Apr. 2-5, 2007, pp. 1527-1531, Toronto, Canada.
Freescale Semiconductor, Dimmable Light Ballast with Power Factor Correction, Designer Reference Manual, DRM067, Rev. 1, Dec. 2005, M68HC08 Microcontrollers, pp. 1-72, Chandler, AZ, USA.
Freescale Semiconductor, Design of Indirect Power Factor Correction Using 56F800/E, Freescale Semiconductor Application Note, AN1965, Rev. 1, Jul. 2005, pp. 1-20, Chandler, AZ, USA.
Freescale Semiconductor, Implementing PFC Average Current Mode Control using the MC9S12E128, Application Note AN3052, Addendum to Reference Design Manual DRM064, Rev. 0, Nov. 2005, pp. 1-8, Chandler, AZ, USA.
Hirota, et al, Analysis of Single Switch Delta-Sigma Modulated Pulse Space Modulation PFC Converter Effectively Using Switching Power Device, Power Electronics Specialists Conference, 2002. pesc 02. 2002 IEEE 33rd Annual, vol. 2, pp. 682-686, Hyogo Japan.
Madigan, et al, Integrated High-Quality Rectifier-Regulators, Industrial Electronics, IEEE Transactions, vol. 46, Issue 4, pp. 749-758, Aug. 1999, Cary, NC, USA.
Renesas, Renesas Technology Releases Industry's First Critical-Conduction-Mode Power Factor Correction Control IC Implementing Interleaved Operations, R2A20112, pp. 1-4, Dec. 18, 2006, Tokyo, Japan.
Renesas, PFC Control IC R2A20111 Evaluation Board, Application Note R2A20111 EVB, all pages, Feb. 2007, Rev. 1.0, pp. 1-39, Tokyo, Japan.

(56) References Cited

OTHER PUBLICATIONS

Miwa, et al, High Efficiency Power Factor Correction Using Interleaving Techniques, Applied Power Electronics Conference and Exposition, 1992. APEC '92. Conference Proceedings 1992., Seventh Annual, Feb. 23-27, 1992, pp. 557-568, MIT, Cambridge, MA, USA.

Noon, Jim, High Performance Power Factor Preregulator UC3855A!B, Texas Instruments Application Report, SLUA146A, May 1996—Revised Apr. 2004, pp. 1-35, Dallas TX, USA.

NXP Semiconductors, TEA1750, GreenChip III SMPS Control IC Product Data Sheet, Rev.01, Apr. 6, 2007, pp. 1-29, Eindhoven, The Netherlands.

Turchi, Joel, Power Factor Correction Stages Operating in Critical Conduction Mode, ON Semiconductor, Application Note AND8123/D, Sep. 2003—Rev. 1 , pp. 1-20, Denver, CO, USA.

ON Semiconductor, Greenline Compact Power Factor Controller: Innovative Circuit for Cost Effective Solutions, MC33260, Semiconductor Components Industries, Sep. 2005—Rev. 9, pp. 1-22, Denver, CO, USA.

ON Semiconductor, Enhanced, High Voltage and Efficient Standby Mode, Power Factor Controller, NCP1605, Feb. 2007, Rev. 1, pp. 1-32, Denver, CO, USA.

ON Semiconductor, Cost Effective Power Factor Controller, NCP1606, Mar. 2007, Rev. 3, pp. 1-22, Denver, CO, USA.

Renesas, Power Factor Correction Controller IC, HA16174P/FP, Rev. 1.0, Jan. 6, 2006, pp. 1-38, Tokyo, Japan.

Seidel, et al, A Practical Comparison Among High-Power-Factor Electronic Ballasts with Similar Ideas, IEEE Transactions on Industry Applications, vol. 41, No. 6, Nov./Dec. 2005, pp. 1574-1583, Santa Maria, Brazil.

Stmicroelectronics, Electronic Ballast with PFC using L6574 and L6561. Application Note AN993, May 2004, pp. 1-20, Geneva, Switzerland.

Stmicroelectronics, Advanced Transition-Mode PFC Controller L6563 and L6563A, Mar. 2007, pp. 1-40, Geneva, Switzerland.

Su, et al, "Ultra Fast Fixed-Frequency Hysteretic Buck Converter with Maximum Charging Current Control and Adaptive Delay Compensation for DVS Applications", IEEE Journal of Solid-Slate Circuits, vol. 43, No. 4, Apr. 2008, pp. 815-822, Hong Kong University of Science and Technology, Hong Kong, China.

Wong, et al, "Steady State Analysis of Hysteretic Control Buck Converters", 2008 13th International Power Electronics and Motion Control Conference (EPE-PEMC 2008), pp. 400-404, 2008, National Semiconductor Corporation, Power Management Design Center, Hong Kong, China.

Zhao, et al, Steady-State and Dynamic Analysis of a Buck Converter Using a Hysteretic PWM Control, 2004 35th Annual IEEE Power Electronics Specialists Conference, pp. 3654-3658, Department of Electrical & Electronic Engineering, Oita University, 2004, Oita, Japan.

International Search Report, PCT/US2012/069942, European Patent Office, Jul. 21, 2014, pp. 1-5.

Written Opinion, PCT/US2012/069942, European Patent Office, Jul. 21, 2014, pp. 1-8.

International Search Report, PCT/US2014/021921, European Patent Office, Jun. 23, 2014, pp. 1-3.

Written Opinion, PCT/US2014/021921, European Patent Office, Jun. 23, 2014, pp. 1-5.

\* cited by examiner

CHARGE PUMP-BASED DRIVE CIRCUITRY FOR BIPOLAR JUNCTION TRANSISTOR (BJT)-BASED POWER SUPPLY

CROSS-REFERENCE TO RELATED APPLICATIONS

This application claims priority to U.S. Provisional Application No. 61/824,725, entitled "Embedded Auxiliary Chip-Supply Path Using the BJT Switch Reverse Recovery Time in the Power Converter Stages," filed May 17, 2013; U.S. Provisional Application No. 61/825,266, entitled "Charge Pump-Based Drive Circuitry for Dimmer-Compatible Lamp," filed May 20, 2013; and U.S. Provisional Application No. 61/825,275 entitled "Bipolar Transistor Dimmer Compatibility Circuit," filed May 20, 2013, the entire contents of which are specifically incorporated by reference herein without disclaimer. This application is related to U.S. Non-provisional patent application Ser. No. 14/280,474, entitled "Single Pin Control of Bipolar Junction Transistor (BJT)-based Power Stage," filed May 16, 2014, the entire contents of which are specifically incorporated by reference herein without disclaimer.

FIELD OF THE DISCLOSURE

The instant disclosure relates generally to methods, apparatus, or implementations concerning or relating to drive circuitry and auxiliary power generation for dimmer compatible lamps.

BACKGROUND

Alternative lighting devices to replace incandescent light bulbs differ from incandescent light bulbs in the manner that energy is converted to light. Incandescent light bulbs include a metal filament. When electricity is applied to the metal filament, the metal filament heats and glows, radiating light into the surrounding area. The metal filament of conventional incandescent light bulbs generally has no specific power requirements. That is, any voltage and any current may be applied to the metal filament, because the metal filament is a passive device. Although the voltage and current need to be sufficient to heat the metal filament to a glowing state, any other characteristics of the delivered energy to the metal filament do not affect operation of the incandescent light bulb. Thus, conventional line voltages in most residences and commercial buildings are sufficient for operation of the incandescent bulb.

However, alternative lighting devices, such as compact fluorescent light (CFL) bulbs and light emitting diode (LED)-based bulbs contain active elements that interact with the energy supply to the light bulb. These alternative devices are desirable for their reduced energy consumption, but the alternative devices have specific requirements for the energy delivered to the bulb. For example, compact fluorescent light (CFL) bulbs often have an electronic ballast designed to convert energy from a line voltage to a very high frequency for application to a gas contained in the CFL bulb, which excites the gas and causes the gas to glow. In another example, light emitting diode (LEDs)-based bulbs include a power stage designed to convert energy from a line voltage to a low voltage for application to a set of semiconductor devices, which excites electrons in the semiconductor devices and causes the semiconductor devices to glow. Thus, to operate either a CFL bulb or LED-based bulb, the line voltage must be converted to an appropriate input level for the lighting device of a CFL bulb or LED-based bulb. Conventionally, a power stage is placed between the lighting device and the line voltage to provide this conversion. Although a necessary component, this power stage increases the cost of the alternate lighting device relative to an incandescent bulb.

One conventional power stage configuration is the buck-boost power stage. FIG. 1 is a circuit schematic showing a buck-boost power stage for a light-emitting diode (LED)-based bulb. An input node 102 receives an input voltage, such as line voltage, for a circuit 100. The input voltage is applied across an inductor 104 under control of a switch 110 coupled to ground. When the switch 110 is activated, current flows from the input node 102 to the ground and charges the inductor 104. A diode 106 is coupled between the inductor 104 and light emitting diodes (LEDs) 108. When the switch 110 is deactivated, the inductor 104 discharges into the light emitting diodes (LEDs) 108 through the diode 106. The energy transferred to the light emitting diodes (LEDs) 108 from the inductor 104 is converted to light by LEDs 108.

The conventional power stage configuration of FIG. 1 provides limited control over the conversion of energy from a source line voltage to the lighting device. The only control available is through operation of the switch 110 by a controller. However, that controller would require a separate power supply or power stage circuit to receive a suitable voltage supply from the line voltage. Additionally, the switch 110 presents an additional expense to the light bulb containing the power stage. Because the switch 110 is coupled to the line voltage, which may be approximately 120-240 Volts RMS with large variations, the switch 110 must be a high voltage switch, which are large, difficult to incorporate into small bulbs, and expensive.

Shortcomings mentioned here are only representative and are included simply to highlight that a need exists for improved drive and auxiliary power generation circuitry, particularly for LED lighting devices. Embodiments described here address certain shortcomings but not necessarily each and every one described here or known in the art.

SUMMARY

A bipolar junction transistor (BJT) may be used as a switch for controlling a power stage or other component of a lighting device, such as a light-emitting diode (LED)-based light bulb. Bipolar junction transistors (BJTs) may be suitable for high voltage applications, such as for use in the power stage and coupled to a line voltage. Further, bipolar junction transistors (BJTs) are lower cost devices than conventional high voltage field effect transistors (HV FETs). Thus, implementations of LED-based light bulbs having bipolar junction transistor (BJT) switches may be lower cost than power stage implementations having field effect transistor (FET) switches.

However, the use of low-cost BJT devices with limited capabilities compared to higher-cost field effect transistors (FETs) may create difficulties in implementation of circuits, such as lighting device power stages, with BJTs. For example, BJTs are current-controlled rather than voltage-controlled devices. Thus, a base current may need to be supplied to a BJT in the power stage. The base current applied to the base of the BJT determines, in part, the current that flows through the collector and emitter of the BJT. Thus, a supply of current for the base of the BJT may be needed, and control over that base current supply may also be needed to implement a BJT in devices with power stages. In embodiments described below, a base current for the BJT may be generated from an emitter output of the BJT. In some embodiments, the base current for the BJT may be controlled through adjusting the timing of control signals.

In some embodiments, a BJT may be used to generate a power supply voltage for a controller in the LED-based light bulb. Although controllers for LED-based light bulbs are described as one possible load for a power supply voltage, other circuits and/or controllers may be operated from the power supply voltage generated by the BJT. Further, these BJT configurations may be used in devices other than LED-based light bulbs.

When the BJT is used to generate a power supply voltage for a controller, a feedback loop may be configured for the BJT such that the power supply voltage is supplied back to the BJT to drive operation of the BJT. For example, a BJT may be configured to provide a power supply voltage at an emitter of the BJT and a base drive circuit may be coupled between the emitter and a base of the BJT to provide a feedback path from the power supply voltage to the base of the BJT.

In certain embodiments, a device may be used in a dimmer compatibility circuit to reduce power dissipation in an integrated circuit (IC) of the dimmer compatibility circuit. For example, a BJT may be used to create a power supply for the IC using a control voltage. The BJT may be used to create the supply voltage while also driving the BJT from the supply voltage. Based on the gain of the BJT, the BJT draws current to create a larger amount of current.

In one method of operation, the base of the BJT may be first charged. Then, the base may be disconnected from the supply voltage, and the emitter may be connected to the control voltage, causing a collector current of the BJT to flow through the emitter and out to the control voltage. The period of time may be faster than the time needed for the BJT to change its mode. This may allow the BJT to be used as a charge pump to create a feedback loop where the BJT operates from the supply voltage and generates the supply voltage.

According to one embodiment, an apparatus that includes a bipolar junction transistor (BJT) may be configured to provide power to a controller. The transistor may include a collector coupled to a high voltage source, an emitter configured to drive current to generate a supply voltage at a supply voltage node; and a base. A base drive circuit may be coupled to the base and configured to receive the supply voltage and drive current to the base to generate a voltage at the base higher than the supply voltage. According to another embodiment, the base drive circuit may also include a charge pump.

The charge pump may include a capacitor coupled between the emitter and a ground and an inverter. The inverter may include a first input coupled to the emitter, a second input coupled to the ground, an output coupled to the base, and a control signal input coupled to receive an input select signal. The input select signal may include a square wave at a frequency selected to generate a desired average direct current (DC) voltage at the output of the inverter.

According to another embodiment, the base drive circuit may include a first switch coupled to the emitter and a ground and configured to receive a first control signal for coupling the emitter to the ground. The base drive circuit may further include a second switch coupled to the base and the supply voltage node and configured to receive a first control signal for coupling the base to the supply voltage node and a third switch coupled between the emitter and the supply voltage node and configured to receive a second control signal for coupling the emitter to the supply voltage node.

The controller may be configured to generate the first control signal and the second control signal such that during a first time period current is driven into the base from the supply voltage node and such that during a second time period current is driven from the collector through the emitter to the supply voltage node. The controller may further generate the first control signal and the second control signal with a switching rate between the first time period and the second time period that is greater than a turn-off time of the bipolar junction transistor (BJT).

According to another embodiment, the base drive circuit may further include a first switch coupled to the emitter and to a ground, and a resistor coupled to the base and to the supply voltage node. The controller may be configured to operate the first switch to disconnect the emitter and the ground to increase a voltage at the supply voltage node.

The apparatus may further include an inductor coupled between the collector and the high voltage source. The base drive circuit may further include a second switch coupled to the emitter and coupled to the supply voltage node, a third switch coupled to the base and to the ground; and a fourth switch coupled to the base and to the supply voltage node. The controller may be configured to operate the first switch, the second switch, the third switch, and the fourth switch to regulate the supply voltage.

According to another embodiment, the base drive circuit may further comprise a first switch coupled to the emitter of the bipolar junction transistor (BJT), wherein the first switch is configured to control a reverse recovery phase of the bipolar junction transistor (BJT) to direct current to the supply voltage node during a first time period and direct current to a load during a second time period.

According to another embodiment, the apparatus may further include a switch coupled to the base of the bipolar junction transistor (BJT) and a resistive digital-to-analog converter (DAC) coupled to the switch. The controller may be configured to adjust the resistive digital-to-analog converter (DAC) to control a duration of a reverse recovery time of the bipolar junction transistor (BJT).

According to another embodiment, the apparatus may further include a second bipolar junction transistor (BJT) comprising a second base; a second emitter coupled to the emitter of the bipolar junction transistor (BJT), a second collector coupled to the high voltage source, and a second base drive circuit coupled to the second base of the second bipolar junction transistor (BJT) and coupled to the supply voltage node. The bipolar junction transistor (BJT) may be configured to drive current to the power supply node during a start-up phase of the controller, and drive current to the power supply node after the start-up phase of the controller.

The controller may include a lighting controller configured to operate a plurality of light emitting diodes (LEDs), wherein the high voltage source is a line voltage source. The lighting controller and the bipolar junction transistor (BJT) may be integrated into an integrated circuit (IC). The apparatus may further include one or more charge switches coupled to a base of the bipolar junction transistor (BJT), the one or more charge switches configured to control current flow to the base; one or more disable switches coupled to the base, the switches configured to stop current flow to the base, and one or more delivery switches coupled to the emitter, the switches configured to deliver the control voltage to the controller.

According to another embodiment, a method may further include receiving, at a collector of a bipolar junction transistor (BJT), a high voltage from a high voltage source; driving, from an emitter of the bipolar junction transistor (BJT), current to a supply voltage node from the high voltage source to generate a supply voltage; and generating, in a base drive circuit, a base drive current for driving a base of the bipolar junction transistor (BJT) to a voltage higher than the supply voltage.

The method may further include charging a junction capacitance of the transistor by closing a transistor charge switch coupled to a base-emitter junction of the transistor at a first time; delivering current from the emitter to the charge voltage by opening the transistor charge and closing a delivery switch at a second time; repeating the charging and delivering at a frequency greater than a turn-off time of the transistor. The base drive circuit may include a charge pump.

The charge pump may include a capacitor coupled between the emitter and a ground, and an inverter. The inverter may include a first input coupled to the emitter, a second input coupled to the ground, an output coupled to the base, and a control signal input coupled to receive an input select signal. The input select signal may include a square wave at a frequency selected to generate a desired average direct current (DC) voltage at the output of the inverter.

The method may further include receiving, at a first switch of the base drive circuit coupled to the emitter and a ground, a first control signal for coupling the emitter to the ground; receiving, at a second switch of the base drive circuit coupled to the base and the supply voltage node, a first control signal for coupling the base to the supply voltage node; and receiving, at a third switch of the base drive circuit coupled between the emitter and the supply voltage node, a second control signal for coupling the emitter to the supply voltage node, and generating, by the controller, the first control signal and the second control signal such that during a first time period current is driven into the base from the supply voltage node and such that during a second time period current is driven from the collector through the emitter to the supply voltage node.

The method may further include generating, by the controller, the first control signal and the second control signal with a switching rate between the first time period and the second time period that is greater than a turn-off time of the bipolar junction transistor (BJT).

The method may further include operating, by the controller, a first switch coupled to the emitter and to a ground; and disconnecting the emitter and the ground to increase a voltage at the supply voltage node, wherein the base drive circuit comprises a resistor coupled to the base and to the supply voltage node. An inductor may be coupled between the collector and the high voltage source.

The method may further include operating, by the controller, the first switch, a second switch coupled to the emitter and coupled to the supply voltage node, a third switch coupled to the base and to the ground, and a fourth switch coupled to the base and to the supply voltage node; and regulating the supply voltage.

The method may further include controlling, by a base drive circuit comprising a first switch coupled to the emitter of the bipolar junction transistor (BJT), a reverse recovery phase of the bipolar junction transistor (BJT); directing current to the supply voltage node during a first time period; and directing current to a load during a second time period.

The method may further include adjusting, by the controller, a resistive digital-to-analog converter (DAC) coupled to a switch coupled to the base of the bipolar junction transistor (BJT); and controlling a duration of a reverse recovery time of the bipolar junction transistor (BJT).

The method may further include driving current, by the bipolar junction transistor (BJT), to the power supply node during a start-up phase of the controller, and driving current, by a second bipolar junction transistor (BJT), to the power supply node after the start-up phase of the controller. The second bipolar junction transistor (BJT) may include a second base; a second emitter coupled to the emitter of the bipolar junction transistor (BJT); a second collector coupled to the high voltage source; and a second base drive circuit coupled to the second base of the second bipolar junction transistor (BJT) and coupled to the supply voltage node.

The method may further include controlling current flow to a base of the bipolar junction transistor (BJT) by operating one or more charge switches coupled to the base; stopping current flow to the base by operating one or more disable switches coupled to the base; and delivering the control voltage to the controller by operating one or more delivery switches coupled to the emitter.

According to another embodiment, a system may include one or more light emitting diodes (LEDs); a line voltage input node configured to receive a high voltage; a controller coupled to the light emitting diodes (LEDs) and configured regulate energy transfer from the line voltage input node to the one or more light emitting diodes (LEDs). The system may further include a bipolar junction transistor (BJT) configured to provide power to the controller. The transistor may include a collector coupled to the line voltage input node, an emitter configured to drive current to generate a supply voltage at a supply voltage node, and a base. A base drive circuit may be coupled to the base and configured to receive the supply voltage and drive current to the base to generate a voltage at the base higher than the supply voltage.

The system may further include one or more charge switches coupled to a base of the bipolar junction transistor (BJT), the one or more charge switches configured to control current flow to the base. The system may further include one or more disable switches coupled to the base, the switches configured to stop current flow to the base. The system may further include one or more delivery switches coupled to the emitter, the switches configured to deliver the control voltage to the controller.

According to another embodiment, an apparatus may include an integrated circuit (IC) configured to couple to a bipolar junction transistor (BJT) through a single pin coupled to an emitter of the bipolar junction transistor (BJT). The integrated circuit (IC) may include a switch coupled to the emitter of the bipolar junction transistor (BJT), and a controller coupled to the switch and configured to control delivery of power to a load by operating the switch.

The foregoing has outlined rather broadly certain features and technical advantages of embodiments of the present invention in order that the detailed description that follows may be better understood. Additional features and advantages will be described hereinafter that form the subject of the claims of the invention. It should be appreciated by those having ordinary skill in the art that the conception and specific embodiment disclosed may be readily utilized as a basis for modifying or designing other structures for carrying out the same or similar purposes. It should also be realized by those having ordinary skill in the art that such equivalent constructions do not depart from the spirit and scope of the invention as set forth in the appended claims. Additional features will be better understood from the following description when considered in connection with the accompanying figures. It is to be expressly understood, however, that each of the figures is provided for the purpose of illustration and description only and is not intended to limit the present invention.

BRIEF DESCRIPTION OF THE DRAWINGS

For a more complete understanding of the disclosed system and methods, reference is now made to the following descriptions taken in conjunction with the accompanying drawings.

DETAILED DESCRIPTION

Figure 1:
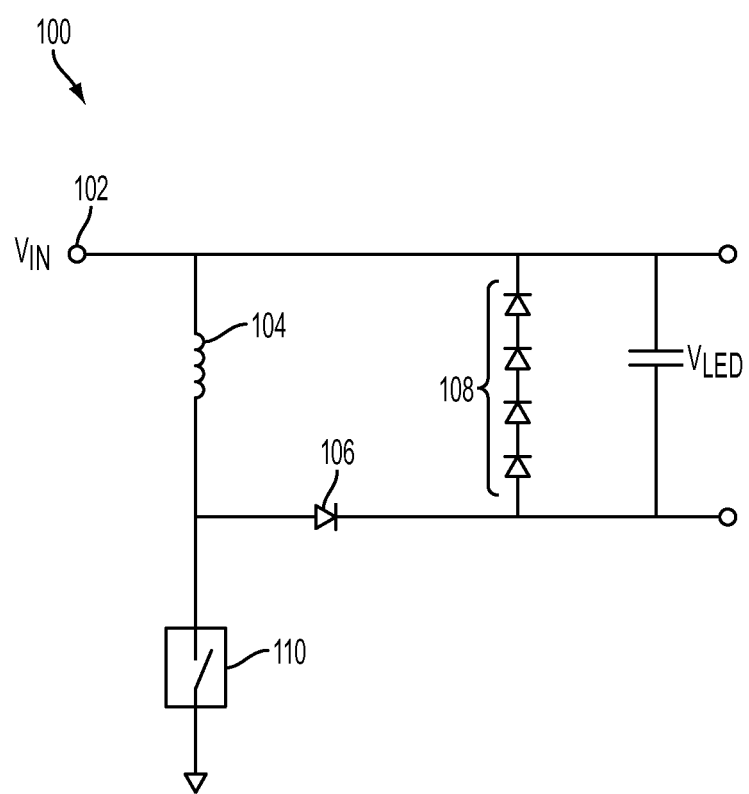
FIG. 1 is a circuit schematic showing a buck-boost power stage for a light-emitting diode (LED)-based bulb in accordance with the prior art.
Figure 2:
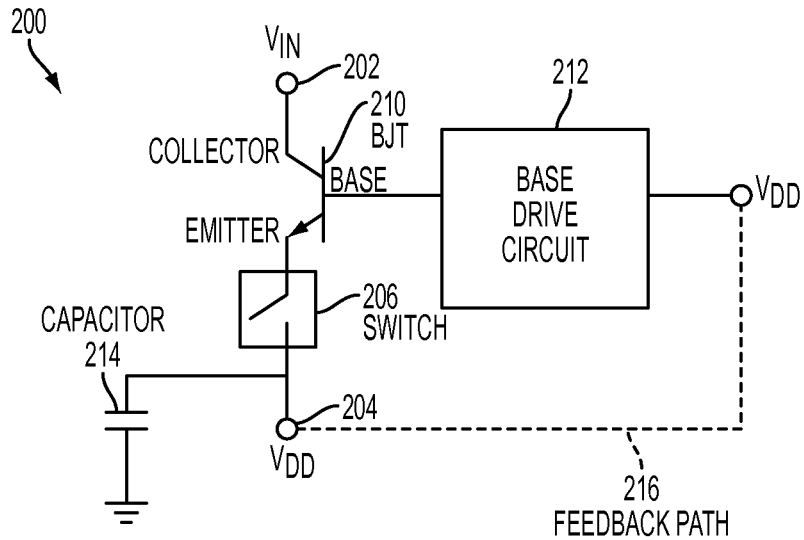
FIG. 2 is a schematic diagram illustrating an auxiliary power supply generation circuit according to an embodiment of the disclosure.

FIG. 2 is a schematic diagram illustrating an auxiliary power supply generation circuit according to an embodiment of the disclosure. A circuit 200 includes a bipolar junction transistor (BJT) 210 with an input voltage node 202 coupled to a collector node of the BJT 210. The input node 202 may receive a high voltage input $V_{IN}$, such as a line voltage of approximately 100-240 Volts. The BJT 210 may be coupled at an emitter node through a switch 206 to a power supply output node 204. The BJT 210 may provide an output voltage $V_{DD}$ at the node 204 suitable for operating low-voltage electronics, such as a controller or other integrated circuits (ICs). A base node of the BJT 210 may be coupled to a base drive circuit 212. The base drive circuit 212 may be powered from the output voltage $V_{DD}$ at the emitter node of the BJT 210 through a feedback path 216.

There may be a voltage drop $V_{BE}$ between the emitter node of the BJT 210 and the base node of the BJT 210. For example, when the desired $V_{DD}$ voltage is 5 Volts, the voltage drop $V_{BE}$ causes the voltage at the base of the BJT 210 to be 5.6 Volts. Electric current will generally not flow from a lower voltage node to a higher voltage node. Thus, the base drive circuit 212 may increase the supply voltage $V_{DD}$ before application to the base node of the BJT 210. For example, the base drive circuit 212 may increase the 5 Volt output to 6 Volts for application to the base node, which allows current to be driven to the base node of the BJT 210 from the output node 204 at the emitter of the BJT 210. The BJT 210 may have an associated gain β that is a ratio of $I_C/I_B$. When the gain β is larger than one, an increase in base current $I_B$ results in a larger increase in collector-emitter current $I_{CE}$. Thus, driving an increased base current to the base node of the BJT 210 results in a net current gain.

Also coupled to the emitter node of the BJT 210 may be a switch 206 for controlling operation of the BJT 210. For example, the switch 206 may be turned on to charge a capacitor 214 coupled to the output node 204. When the switch 206 is turned off, the supply voltage $V_{DD}$ at the output node 204 may be held relatively constant by charge on the capacitor 214. Toggling of the switch 206 may control operation of the BJT 210 creating an emitter-controlled BJT.

Figure 3:
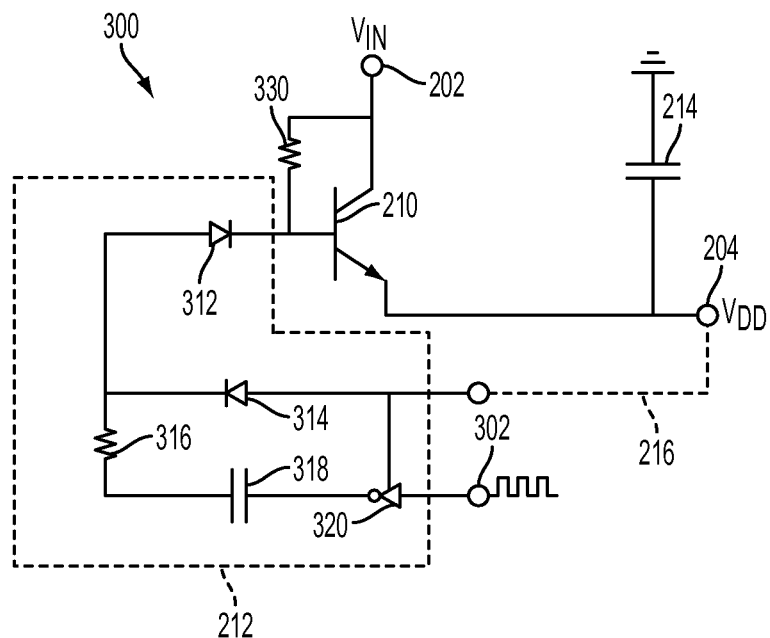
FIG. 3 is a schematic diagram illustrating an auxiliary power supply generation device with a charge pump base drive circuit according to one embodiment of the disclosure.

In one embodiment, the base drive circuit 212 may be a charge pump. A charge pump circuit receives an input voltage and generates a higher output voltage from the input voltage. The charge pump may be configured as the base drive circuit 212 coupled between the emitter node and the base node of the BJT 210 for generating a higher voltage at the base node from the supply voltage $V_{DD}$ at the emitter node. FIG. 3 is a schematic diagram illustrating an auxiliary power supply generation device with a charge pump base drive circuit according to one embodiment of the disclosure. A circuit 300 may include the base drive circuit 212 coupled to the emitter node of the BJT 210 through the feedback path 216. The base drive circuit 212 may include an inverter 320 coupled to a capacitor 318, a resistor 316, a diode 314, and a diode 312. The inverter 320 may be driven by a signal received at node 302, which may be driven, for example, from an external signal generated by a controller receiving power from the output node 204.

The inverter 320 receives power from supply voltage $V_{DD}$ through the feedback path 216 and switches the supply voltage $V_{DD}$ on and off of the capacitor 318 based on the input signal 302. The input signal 302 may be, for example, a square wave signal with a frequency higher than the switching frequency of the BJT 210. In one embodiment the frequency of signal 302 may be approximately 1-20 Megahertz. The inverter 320 charges the capacitor 318, which discharges into the base node of the BJT 210 through the diode 312 and the resistor 316. When the frequency of the signal 302 is higher than the switching frequency of the BJT 210, the BJT 210 operates based on the average direct current (DC) voltage of the output of the capacitor 318. Further, the current to the base node of the BJT 210 may be adjusted by varying the frequency of the signal 302. For example, a controller powered from the supply voltage $V_{DD}$ may vary the frequency of signal 302 to adjust operation of the BJT 210 and vary the supply voltage $V_{DD}$ at output node 204. For example, if the output of the BJT 210 is insufficient to maintain a minimum supply voltage $V_{DD}$ for proper operation of a controller (not shown), the controller may increase a frequency of the signal 302.

A resistor 330, which may be used to start the circuit 200, may be coupled between the BJT 210 and the input node 202. The resistor 330 may also be used to sense voltage at the input node 202. The diode 312 may also be used to startup the base drive circuit 212. Alternate configurations of the circuit 200 may replace diodes 312 and 314 with other semiconductor devices, such as low-voltage field effect transistor (FET) switches.

In some embodiments, the capacitor 318 may be incorporated into an integrated circuit (IC) with other components. When integrated, the capacitor 318 may be implemented with a metal-oxide-semiconductor (MOS) FET transistor and switched at a high frequency (e.g., 20 MHz) to allow use of a physically small capacitor. In some embodiments, the charge pump circuit 212 may be used in a TRIAC compatibility circuit to provide either a glue current or a TRIAC attach current.

In a TRIAC-based dimmer during a period (referred to as "$T_{OFF}$") of a phase-cut input voltage half line cycle from the time the half line cycle reaches a zero crossing until reaching a leading edge of a phase-cut input voltage, the dimmer does not conduct and, thus, phase cuts the supply voltage prior to conducting. During the non-conduction period $T_{OFF}$, to properly recharge timing circuitry of the dimmer, the dimmer current has a glue value and is sometimes referred to in this non-conduction phase as a glue current. The glue value varies by dimmer, for example, from 10 mA to 300 mA. When the output voltage of the dimmer (referred to as phase-cut voltage $V_{O,DIM}$) reaches a firing voltage $V_F$ level, the dimmer fires (i.e. begins conducting) and conducts a dimmer current having a firing value and is sometimes referred to at this event as a firing current. A typical firing value is 5 mA-50 mA. In at least one embodiment, the firing value equals an attach current value and is, for example, 50 mA. An attach state begins at the leading edge LE(n) and occurs during an initial charge transfer period from the leading edge LE(n).

Figure 4A:
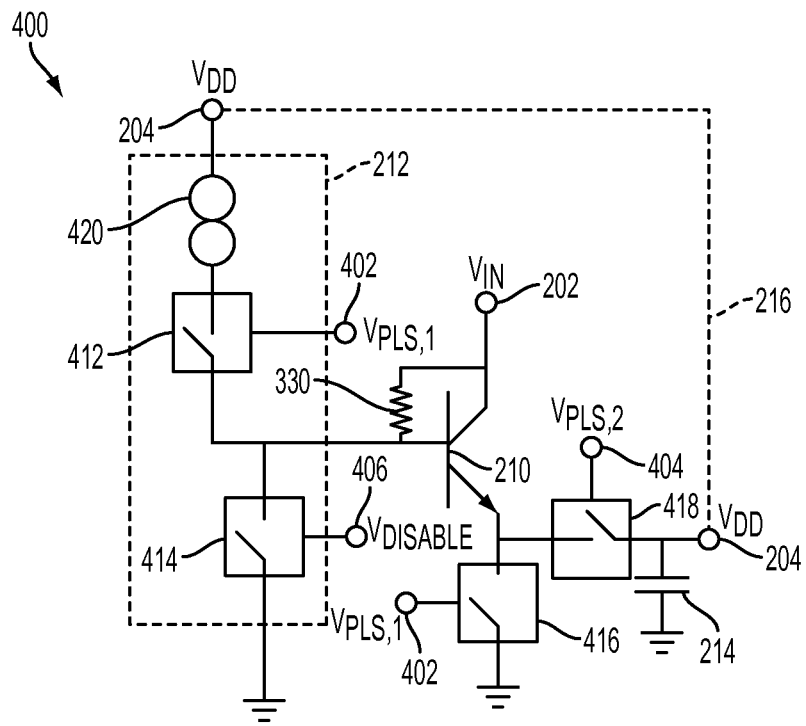
FIG. 4A is a schematic diagram illustrating an auxiliary power supply generation device with a transistor configured to operate as a charge pump according to one embodiment of the disclosure.

In another embodiment of an auxiliary power supply generation circuit, the BJT 210 may be configured to operate as a charge pump using an intrinsic capacitance of the BJT 210. FIG. 4A is a schematic diagram illustrating an auxiliary power supply generation device with a transistor configured to operate as a charge pump according to one embodiment of the disclosure. The base drive circuit 212 coupled between the base node and emitter node of the BJT 210 may include a current source 420 and a switch 412. The switch 412 may toggle to couple or decouple the base node of the BJT 210 from the current source 420 powered by the supply voltage $V_{DD}$ received through the feedback loop 216 from output node 204. The feedback loop 216 couples the emitter node output of the BJT 210 to the base node input of the BJT 210.

Switches 416 and 418 may be coupled at the emitter node of the BJT 210, similar to emitter switch 206 of FIG. 2. The switch 416 may toggle to couple the emitter node to ground, and the switch 418 may toggle to couple the emitter node to output node 204. When the switch 412 is on, the switch 416 is on, and the switch 418 is off, current is driven from the current source 420 to the base node of the BJT 210 to charge the base of the BJT 210. When the switch 412 is off, the switch 416 is off, and the switch 418 is on, current is passed from the input voltage 202 at the collector node to the emitter node of the BJT 210 to generate power supply voltage $V_{DD}$. A cycle may be created including, during a first time period, charging the base node of the BJT 210 from the power supply voltage $V_{DD}$ to operate the BJT 210 and, during a second time period, charging the capacitor 214 to generate the supply voltage $V_{DD}$, while the base charge discharges.

Figure 4B:
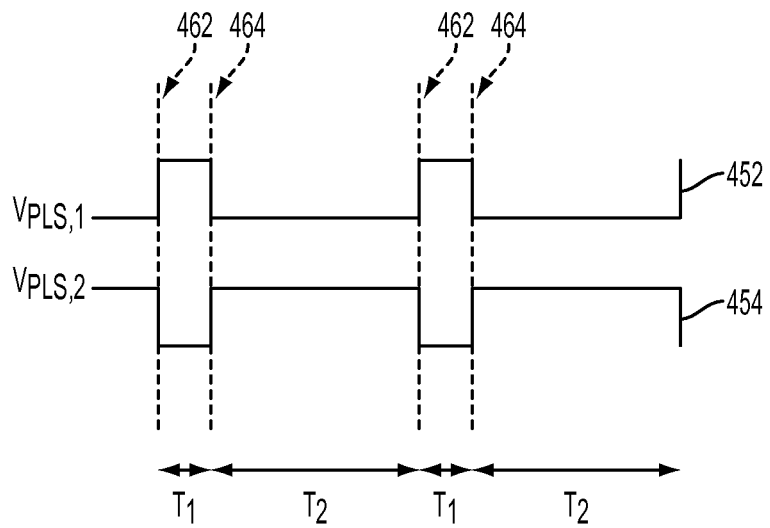
FIG. 4B are graphs illustrating operation of an auxiliary power supply generation device, such as that of FIG. 4A, according to one embodiment of the disclosure.

The operation of the circuit 400 is shown in graphs in FIG. 4B. FIG. 4B is are graphs illustrating operation of an auxiliary power supply generation device, such as that of FIG. 4A, according to one embodiment of the disclosure. A $V_{PLS,1}$ signal 452 may be applied to the switch 412 and the switch 416 through input node 402, and a $V_{PLS,2}$ signal 454 may be applied to the switch 418 through input node 404. At time 462, the $V_{PLS,1}$ signal 452 switches to high to turn on switches 412 and 416 and the $V_{PLS,2}$ signal 454 switches to low to turn off switch 418. After a first duration T1, the $V_{PLS,1}$ signal 452 switches to low and the $V_{PLS,2}$ signal 454 switches to high. After a second duration T2, the signals 452 and 454 may continue to cycle through the time periods T1 and T2. During the first duration T1, the base of the BJT 210 is charged from the current source 420, and during the second duration T2, the capacitor 214 is charged to generate supply voltage $V_{DD}$. The duration of time for T1 and T2 may be varied by a controller to adjust a level of the supply voltage $V_{DD}$. In one embodiment, the signals 452 and 454 may be received as a single signal. The single signal may be split and one branch passed through as the $V_{PLS,1}$ signal and a second branch passed to an inverter for generating $V_{PLS,2}$ signal. Thus, the circuit 400 may be controlled through a single signaling pin connection from a controller.

The circuit 400 utilizes an intrinsic capacitance at the base node of the BJT 210 and operates the intrinsic capacitance as a charge pump for operating the BJT 210. In this configuration, the BJT 210 provides double-duty as a charge pump and a generator of the supply voltage $V_{DD}$. The switching frequency from T1 to T2 and back to T1 by signals $V_{PLS,1}$ and $V_{PLS,2}$ may be at a frequency faster than the response period of the BJT 210. Thus, the BJT 210 may remain switched on during the T1 and T2 time periods. Further, with sufficiently high switching frequency, a collector current from the BJT 210 may be relatively constant and more charge may be delivered to supply voltage $V_{DD}$ during time period T2 than was consumed in a base current during time period T1. A net current generation may be obtained when time period T1 is less than time period T2.

In one configuration of the circuit 400, a switch 414 may couple the base node of the BJT 210 to a ground. The switch 414 may disable operation of the circuit 400 by coupling the base of the BJT 210 to turn off the BJT 210. The switch 414 may be controlled by a disable signal received at input node 406. This functionality may be useful when using the circuit 400 for glue and release functions in LED lighting dimming applications. Additional details regarding functions in LED lighting dimming applications are described in U.S. Pat. No. 8,610,364 to John L. Melanson and entitled "Coordinated dimmer compatibility functions" and in U.S. Patent Application Publication No. 2012/0049752 to Eric J. King and John L. Melanson and entitled "Multi-mode Dimmer Interfacing Including Attach State Control," which are hereby incorporated by reference in their entirety.

In some embodiments, switches 412, 414, 416, and/or 418 may be integrated into a controller IC powered from the generated supply voltage $V_{DD}$. The switches 412, 414, 416, and/or 418 may be FETs, BJTs, or diodes. In some embodiments, the rate, duty cycle of operation, and the forward base current may all be chosen to operate at a desired collector current and auxiliary current flowing from the output node 204. As with the circuit 300 of FIG. 3, a resistor 330 may be coupled between the base node of the BJT 210 and the input node 202 to provide start-up of the base drive circuit 212.

An auxiliary power supply generation circuit may be configured to share an input voltage with a load other than the controller operating from supply voltage $V_{DD}$. In the case of a LED-based light bulb, the other load may be light emitting diodes (LEDs). Further, efficiency of power conversion from the line voltage to the supply voltage $V_{DD}$ may be improved by use of an inductor with the BJT 210. The embodiments described above with reference to FIG. 3A and FIG. 4A couple the line voltage at input node 202 directly to the BJT 210. As a result, the entire voltage of the line voltage is dissipated through the circuits 300 and 400 of FIG. 3A and FIG. 4A. Such power dissipation may be desirous in circuits, such as dimmer compatibility circuits, startup circuits, glue circuits, and leading edge attach circuits. However, the power dissipation may be reduced through use of an inductor coupled between the collector node of the BJT 210 and the line voltage at input node 202.

Figure 5A:
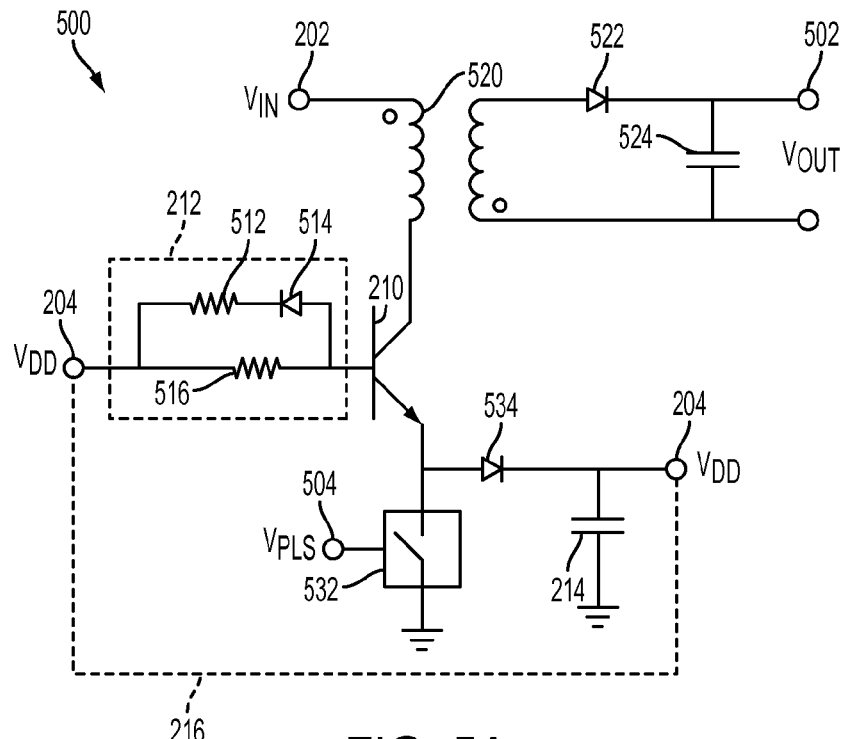
FIG. 5A is a circuit illustrating an auxiliary power supply generation circuit with an inductor coupling at the BJT according to one embodiment of the disclosure.

FIG. 5A is a circuit illustrating an auxiliary power supply generation circuit with an inductor coupling at the BJT according to one embodiment of the disclosure. A circuit 500 may include the BJT 210 coupled to the input node 202 through an inductor 520. A base drive circuit 212 may be coupled to the base node of the BJT 210 and drive the base from a supply voltage $V_{DD}$ received through the feedback loop 216. The emitter node of the BJT 210 is coupled to capacitor 214 at the output node 204 to generate the supply voltage $V_{DD}$. The inductor 520 may allow the circuit 500 to provide multiple functions including generating the supply voltage $V_{DD}$ with the BJT 210 and providing an output voltage, $V_{OUT}$, to operate a load, such as light emitting diodes (LEDs) for generating light from a light bulb.

To generate the output voltage, $V_{OUT}$, a winding of the inductor 520 may be coupled to a diode 522 and capacitor 524. Output node 502 coupled to the capacitor 524 may be coupled to a lighting load for operation from the input voltage 202.

To generate the supply voltage, $V_{DD}$, a winding of the inductor 520 may couple input voltage $V_{IN}$ to the collector node of the BJT 210. The BJT 210 passes current from the input node 202 through the collector node and the emitter node of BJT 210 to the capacitor 214 through diode 534. The base drive circuit 212 for maintaining operation of the BJT 210 may include a first current path including the resistor 512 and the diode 514 and a second current path including the resistor 516. Each of the current paths may begin at input node 204 of supply voltage $V_{DD}$ and end at the base node of the BJT 210. Selection of which current path is active may be controlled based in part through a switch 532 at the emitter node of the BJT 210.

Figure 5B:
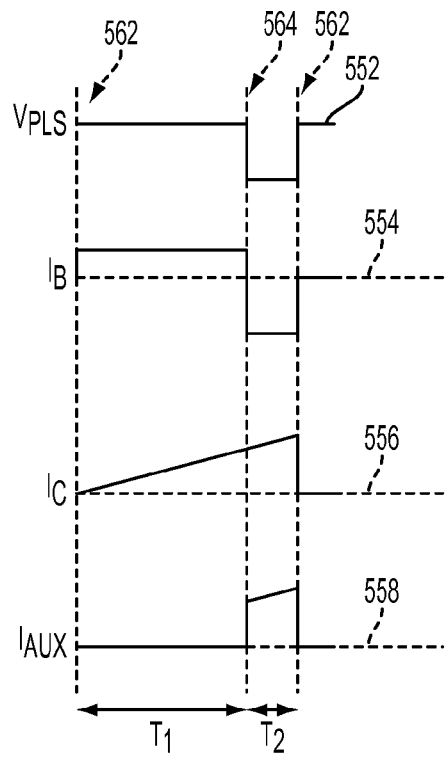
FIG. 5B are graphs illustrating operation of the circuit of FIG. 5A through a control signal according to one embodiment of the disclosure.

The operation of the BJT 210 may be controlled through the switch 532 coupled between the emitter node of the BJT 210 and ground. The switch 532 operates similarly to the switch 206 of FIG. 2. The switch 532 may be toggled based on a $V_{PLS}$ signal received at input node 504. Operation of the circuit 500 is illustrated through the graphs of FIG. 5B. FIG. 5B are graphs illustrating operation of the circuit of FIG. 5A through a control signal according to one embodiment of the disclosure.

At time 562, a $V_{PLS}$ control signal 552 is high and the switch 532 is closed. The $V_{PLS}$ signal 552 remains high for duration T1 during which the BJT 210 is on, and current passes through the collector node and the emitter node of the BJT 210 from the input node 202 to ground. During time period T1, the collector current $I_C$ increases linearly as shown in line 556.

While the switch 532 is closed, current in the base drive circuit 212 flows through the second current path of resistor 516 to charge the base of the BJT 210. A positive base current $I_B$ is shown in line 554.

At time 564, the $V_{PLS}$ control signal 552 switches to low and the switch 532 opens. After the switch 532 opens, the BJT 210 may continue to conduct for a short duration, such as several microseconds, during which base charge discharges from the BJT 210 through the first current path of the base drive circuit 212 including the resistor 512 and the diode 514. For the duration T2, during which the BJT 210 continues to conduct, the collector current $I_C$ is passed through the diode 534 to the capacitor 214 to generate the supply voltage $V_{DD}$. This current is shown as $I_{aux}$ in line 558 as the current through the diode 534.

Through the process of time periods T1 and T2, the circuit 500 may be a net generator of power for the supply voltage $V_{DD}$ while the inductor 520 provides power to a load at $V_{OUT}$, such as LEDs in a light bulb. The BJT 210 may generate the supply voltage $V_{DD}$ by consuming a limited amount of power from the input node 202 through the inductor 520. The circuit 500 may be efficient and provide, for example, nearly one-to-one ratio in power consumed by the circuit 500 and power generated by the circuit 500. In one embodiment, the circuit 500 may be configured to generate a 5 Volts, 10 mA (50 mW) output and consume approximately 50 mW from the input node 202.

Figure 6A:
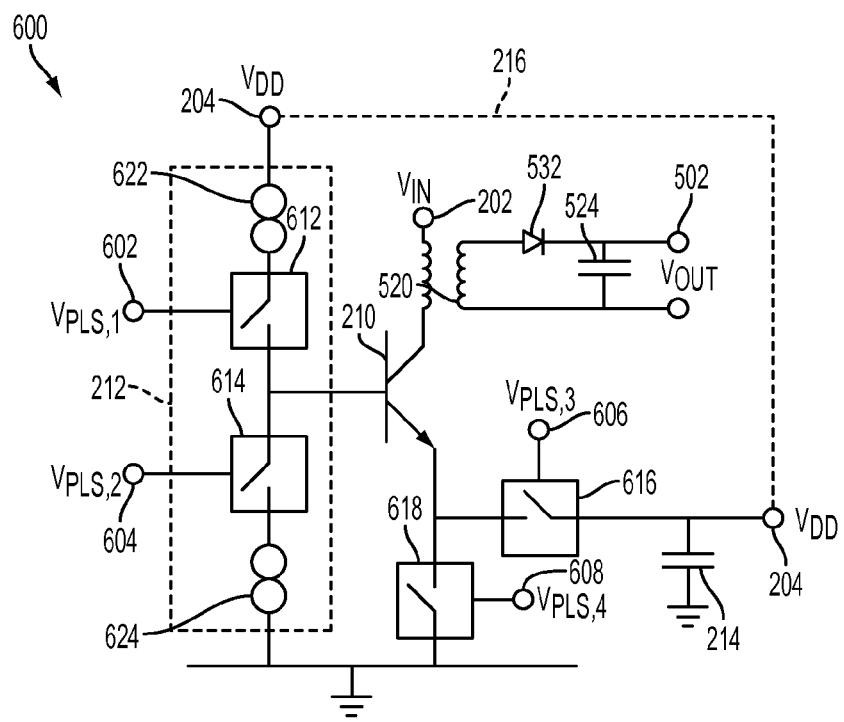
FIG. 6A is a circuit illustrating an auxiliary power supply generation circuit with an inductor coupling at the BJT according to another embodiment of the disclosure.

Additional control of a circuit with the BJT 210 and the inductor 520 may be gained through implementation of additional switches. FIG. 6A is a circuit illustrating an auxiliary power supply generation circuit with an inductor coupling at the BJT according to another embodiment of the disclosure. A circuit 600 may include a BJT 210 coupled to the input node 202 through the inductor 520. The emitter node of the BJT 210 may be coupled to ground through a switch 618 controlled by a $V_{PLS,4}$ signal received at input node 608. The emitter node of the BJT 210 may be also coupled to the output node 204 for supply voltage $V_{DD}$ through switch 616 controlled by $V_{PLS,3}$ signal received at input node 606. The base drive circuit 212 may include a first switch 612 coupling the base node of the BJT 210 to a first current source 622 powered by the supply voltage $V_{DD}$ through the feedback loop 216. The base drive circuit 212 may also include a second switch 614 coupling the base node of the BJT 210 to a second current source 624 coupled to ground. The current source 624 may be, for example, set as a ratio of a peak current $I_{C,peak}$ at the collector node of the BJT 210. In one embodiment, the current source 624 may be set as 40% of the peak current $I_{C,peak}$.

The switches 612, 614, 616, and/or 618 may allow timing of the reverse base current to be controlled and the level of forward base current and the level of the reverse base current to be controlled. This may allow for a controller generating the $V_{PLS,1}$-$V_{PLS,4}$ signals to regulate the supply voltage $V_{DD}$. In one embodiment, the controller may regulate the supply voltage $V_{DD}$ to minimize lost charge and efficiency by generating only a supply current needed for the controller and/or other loads powered from node 204.

Figure 6B:
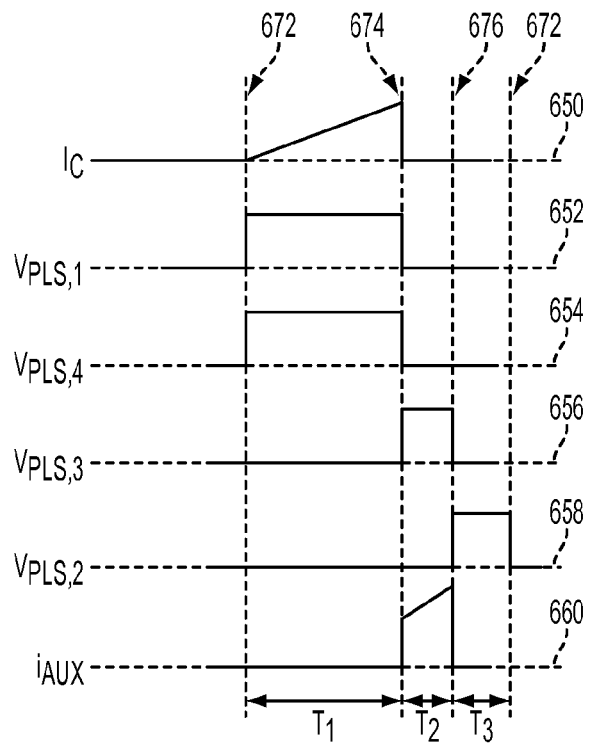
FIG. 6B are graphs illustrating currents within the circuit of FIG. 6A at various states of the control signals illustrated in FIG. 6A according to one embodiment of the disclosure.

One mode of operation of the circuit 600 is shown in FIG. 6B. FIG. 6B illustrates currents within circuit 600 of FIG. 6A at various states of the control signals illustrated in FIG. 6A according to one embodiment of the disclosure. At time 672, a $V_{PLS,1}$ signal 652 and a $V_{PLS,4}$ signal 654 may be high to close the switches 612 and 618. The signals 652 and 654 may remain high for a first time duration, T1. During T1, current flows through the collector node to the emitter node of the BJT 210 and to the ground through the switch 618 and the collector current $I_C$ 650 linearly increases. Further during time period T1, current flows to the base node of the BJT 210 to operate the BJT 210 from the supply voltage $V_{DD}$.

At time 674, the signals 652 and 654 are switched low to open the switches 612 and 618. The $V_{PLS,3}$ signal 656 is switched to high to close the switch 616 and current flows through the BJT 210 from the input node 202 through the collector node and the emitter node of BJT 210 to the output node 204 to charge the capacitor 214. The current from the emitter node of the BJT 210 to the output node 204 is shown as auxiliary current $i_{aux}$ in line 660 and generates supply voltage $V_{DD}$. During a second time period T2, when the signal 656 is high, auxiliary current $i_{aux}$ linearly increases by following the current ramp rate of the collector current $I_C$ of line 650 from time period T1. During T2, the BJT 210 is acting as a storage element for charge on its base node and this stored charge maintains operation of the BJT 210.

At time 676, the signal 656 switches to a low signal to open the switch 616, which terminates output of the auxiliary current $i_{aux}$ and terminates charging of the capacitor 214. The $V_{PLS,2}$ signal 658 is switched to a high signal for duration T3 to close the switch 614 to drive a negative base current from the BJT 210. The conditions for time 672 may then be returned to after duration T3. The cycle of T1, T2, and T3 may be repeated to operate the circuit 600 and generate supply voltage $V_{DD}$.

The $V_{PLS,1}$-$V_{PLS,4}$ signals may be generated by a controller operating from the supply voltage $V_{DD}$. The controller may adjust the timings T1, T2, and T3 by manipulating the $V_{PLS,1}$-$V_{PLS,4}$ signals to obtain a desired supply voltage $V_{DD}$. In particular, the time period T2 may be increased in duration to provide a higher supply voltage $V_{DD}$ or decreased in duration to provide a lower supply voltage $V_{DD}$. In one embodiment, a controller IC powered from the supply voltage $V_{DD}$ may operate at between 4-6 Volts. Thus, the time period T2 may be increased when $V_{DD}$ nears 4V, and the time period T2 may be decreased when $V_{DD}$ nears 6V.

Bipolar junction transistors (BJTs) configured as described above may be used in a dimmer interface circuit for a LED light bulb. BJTs are a lower cost component than many other semiconductor devices and thus may result in a lower cost LED light bulb. Further, in certain configurations, the BJT may be shared for both switch mode supply and for glue operation in a LED light bulb. Although light bulb applications are described below, the BJT configurations described above may be used in any circuit for generating a supply voltage $V_{DD}$.

Figure 7:
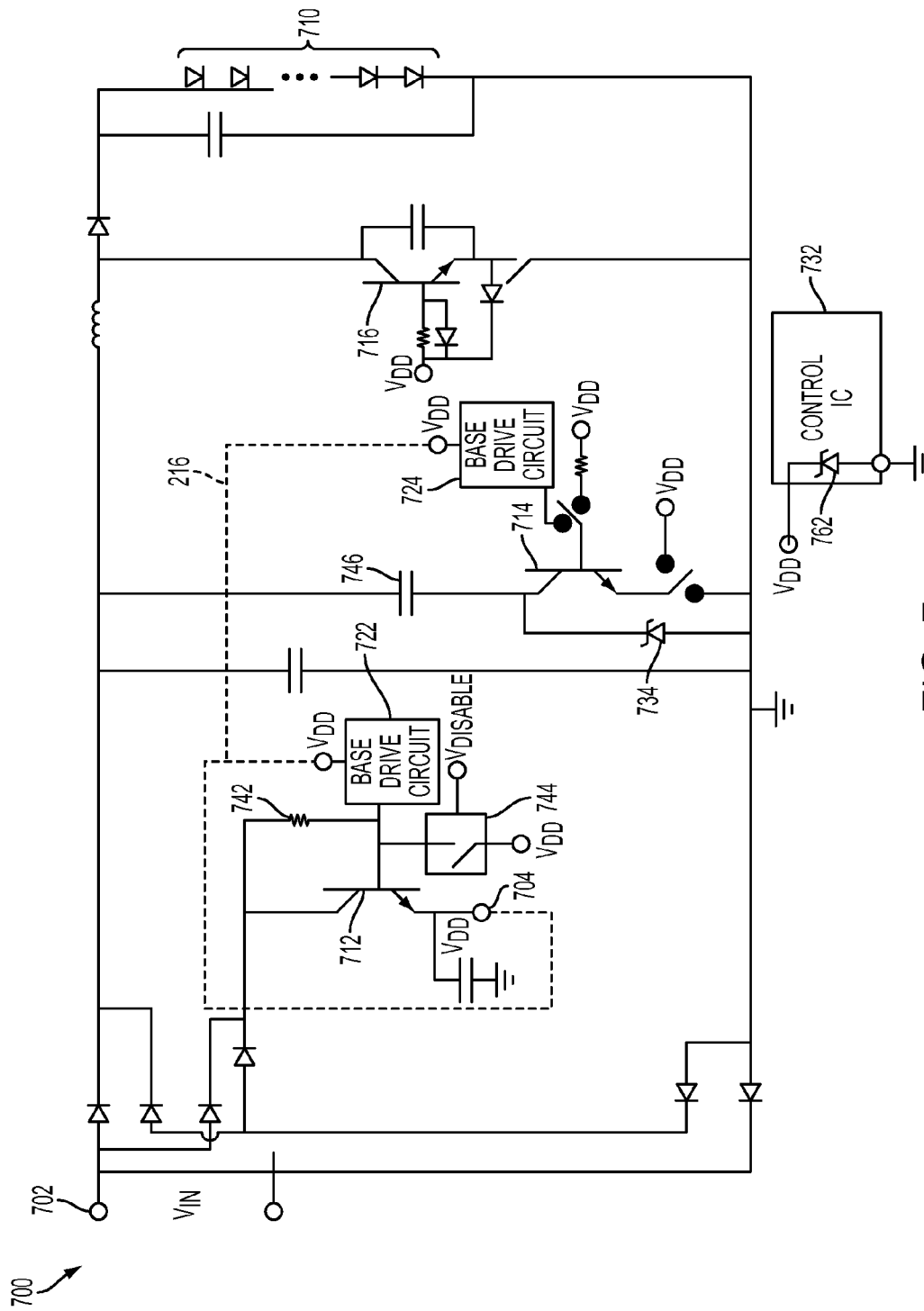
FIG. 7 is a circuit illustrating a dimmer interface circuit for a LED-based light bulb using bipolar junction transistors according to one embodiment of the disclosure.

FIG. 7 is a circuit illustrating a dimmer interface circuit for a LED-based light bulb using bipolar junction transistors according to one embodiment of the disclosure. Circuit 700 may include an input node 702 for receiving a high voltage, such as a line voltage, relative to the operation of controller devices. The circuit 700 may generate supply voltage $V_{DD}$ at node 704 through a BJT 712 with a base drive circuit 722. The BJT 712 and base drive circuit 722 may be any of the configurations described above with reference to FIGS. 2-6. The supply voltage $V_{DD}$ may be used to operate the base drive circuits 722 and 724. Thus, a feedback loop 216 may allow operation of the BJTs 712 and 714 from a supply voltage generated with the BJTs 712 and 714. The base drive circuit 724 may drive a BJT 714 to control current through LEDs 710. The supply voltage $V_{DD}$ may also be used to power a control IC 732, which may control operation of components of the circuit 700, such as by generating control signals for switches of the circuit 700.

The circuit 700 may be configured to run in two modes of operation. In a first mode, the emitter node of BJT 714 may be connected to supply voltage $V_{DD}$ and the base node of the BJT 714 may be driven by base drive circuit 724. The base node of the BJT 714 may also be driven by base drive circuit 722 that drives the BJT 712, such as when components are shared between the charge pumps 722 and 724. In a second mode of operation, the emitter node of BJT 714 may be coupled to ground, and the base node of the BJT 714 may be driven by supply voltage $V_{DD}$. In this mode, a high current capacitor may be used. In both modes, the current in the BJT 714 may be measured by the current into a pin (not shown).

A Zener diode 734 may be coupled between the collector node of BJT 714 and ground. In one embodiment, the Zener diode 734 may have an 80 V threshold, and BJT 714 may have a 100 V breakdown threshold. The configuration of BJT 714 with the Zener diode 734 may provide a higher current gain at the BJT 714, on the order of 50-100 Amps/Amps. Switching output circuitry built around a BJT 716, such as BJTs 712 and 714 and circuitry coupled around the BJTs 712 and 714, may allow for low power supply current drain. Depending on the choice of drive current, much of the base charge may be recovered.

The circuit 700 may operate to provide a glue phase in a LED-based light bulb. When the BJT 712 is off, a current through resistor 742 may be measured to determine an input voltage ($V_{IN}$). When input voltage $V_{IN}$ is sensed to rise above a threshold level, the BJT 712 may be activated by the charge pump 722. This charge pump activation may drop the input voltage $V_{IN}$ and return charge to the supply voltage $V_{DD}$. The charge provided by charge pump 722 may be modulated, providing regulation of the input voltage V. The charge can alternatively be controlled in a hysteretic mode. One charge threshold may be on the order of 10 V to assist in avoiding a significant increase in the power dissipation of the BJT 712. When not in use, the glue circuitry (e.g., circuitry associated with BJT 712 including the BJT 712) may be disabled by closing disable switch 744.

The circuit 700 may also operate to provide a full line-energy harvesting mode in a LED-based light bulb. Charge pump 724 associated with BJT 714 may be activated when a line voltage is below 20 V and when supply voltage $V_{DD}$ is determined to be insufficient, such as too low to operate control IC 732. Activation of the charge pump 724 may then allow sufficient energy for IC controller operation. Charge pump 724 may also be enabled when a trailing edge (TE) is sensed or calculated.

The circuit 700 may also operate in an attach phase of an LED-based light bulb. Circuitry associated with the BJT 714, including the base drive circuit 724, may be enabled to draw current from a dimmer only when the input voltage at a lamp is greater in magnitude than the input voltage ($V_{IN}$) to the dimmer. Wasted power may thus be minimized. For a high attach current, the emitter of the BJT 714 may be pulled to ground, and the base of the BJT 714 may be driven by supply voltage $V_{DD}$. The drive may be from a current source to ground to tightly control the current. Alternatively, the base current may be controlled if the BJT 714 has limited current gain. Additional current may be drawn by the BJT 712, which may be used to provide attach current directly to the base drive of the BJT 714.

After an attach phase, it may be desirable to charge capacitor 746 to a higher voltage. This charging may be accomplished by emitter to ground switching of the BJT 714 or emitter to supply voltage $V_{DD}$ switching of the BJT 714 with charge pump 722 or 724. The mode may be chosen to regulate and/or optimize the supply voltage $V_{DD}$. Optional Zener diode 734 may limit the voltage on the BJT 714 during the charging phase of capacitor 746 and an attach phase, allowing for a lower voltage for the BJT 714.

In open phase of capacitor 746, the BJT 714 may be turned off and line power may directly drive a DC-DC output stage 1n the empty phase of capacitor 746, such as when the capacitor 746 is discharging, the line voltage may be below a voltage on capacitor 746. In this phase, Zener diode 734 may conduct in a forward direction and capacitor 746 may power a DC-DC converter stage. The voltage on capacitor 746 is thereby reduced to a value appropriate for a next attach phase.

Figure 8:
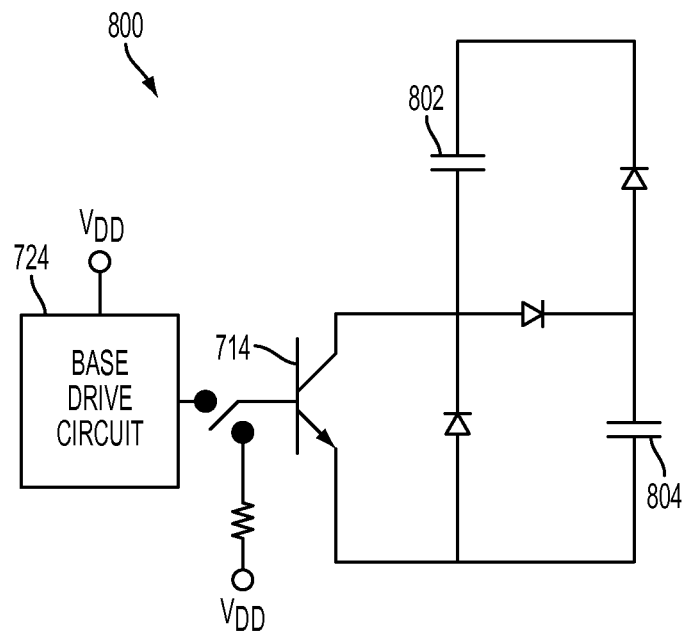
FIG. 8 is a circuit illustrating a dimmer compatibility circuit with two capacitors for attach phase operations according to one embodiment of the disclosure.

Power factor and efficiency may be improved by splitting capacitor 746 into separate capacitors. FIG. 8 is a circuit illustrating a dimmer compatibility circuit with two capacitors for attach phase operations according to one embodiment of the disclosure. In circuit 800, the BJT 714 is coupled to capacitors 802 and 804. The BJT 714 may draw current for an attach phase. After the attach phase, current may be drawn to further charge capacitor 802, or may charge capacitor 802 at the peak of the line in series with capacitor 804.

Figure 9:
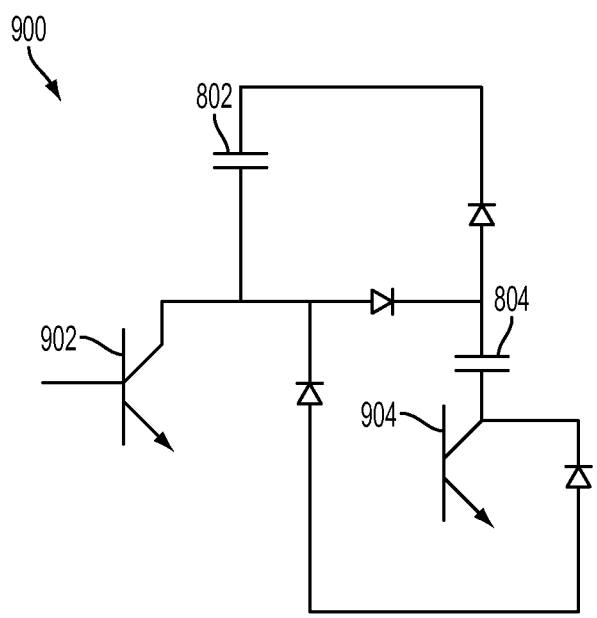
FIG. 9 is a circuit illustrating current control for two capacitors with two transistors according to one embodiment of the disclosure.

In the circuit 800 with two capacitors 802 and 804, current for each capacitor may be individually controlled through a pair of transistors (not shown) corresponding to the capacitors 802 and 804. FIG. 9 is a circuit illustrating current control for two capacitors with two transistors according to one embodiment of the disclosure. In circuit 900, transistors 902 and 904 may be used to control the current through capacitors 802 and 804. The circuit 900 may allow for additional current shaping and a higher power factor and/or efficiency.

Figure 10:
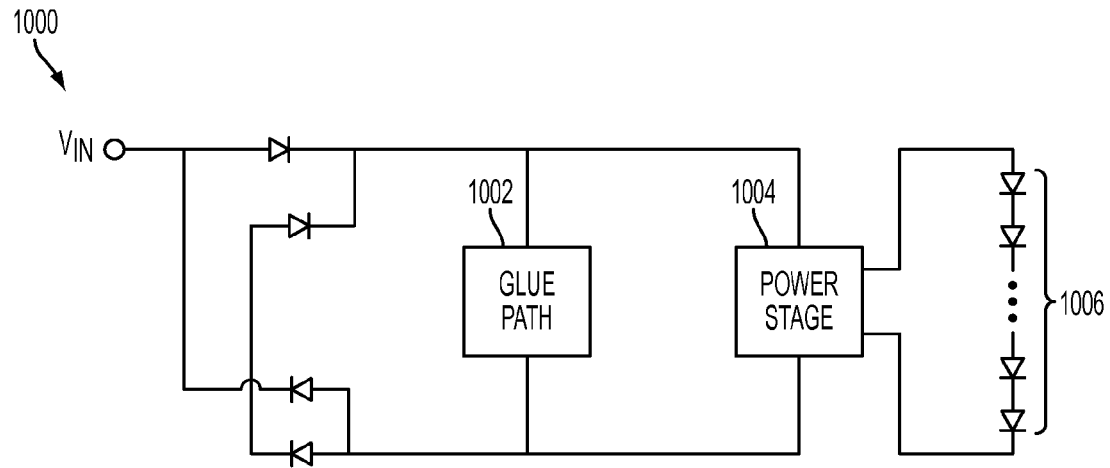
FIG. 10 is a circuit illustrating a drive circuit for an LED-based light bulb.

More generically, the BJT configurations described above may be used in any glue circuitry of an LED-based light bulb. FIG. 10 is a circuit illustrating a drive circuit for an LED-based light bulb. A circuit 1000 includes a glue path 1002 coupled in parallel with a power stage 1004. The glue path 1002 may be activated during a time period commencing at the dimmer disconnect time and ending at the rise of a leading-edge phase-cut dimmer. The glue path 1002 may also be activated at other times. For example, when a LED-based light bulb is coupled to a non-dimming circuit and activated during relatively low voltage portions of the line voltage, the glue path 1002 may be activated to provide power from the line for the IC controller. In another example, the glue path 1002 may be activated during a final phase of a trailing-edge dimmer.

The power stage 1004 may be, for example, a switch-mode power stage, and provide regulated power to light emitting diodes (LEDs) 1006. The glue path 1002 may be configured to maintain a low-impedance path during appropriate portions of a line cycle. Power stage 1004 may be configured according to one of a buck, boost, flyback, or buck-boost converter topology. The output of power stage 1004 may be an approximately constant current when LEDs 1006 are used. In other embodiments, switch-mode power supply 1004 may be configured to drive a gas discharge lamp system. The brightness of the lamp, such as LED lamp 1006 or a gas discharge lamp, may generally be varied in conformity with an observed input phase-cut of a dimmer signal.

Figure 11:
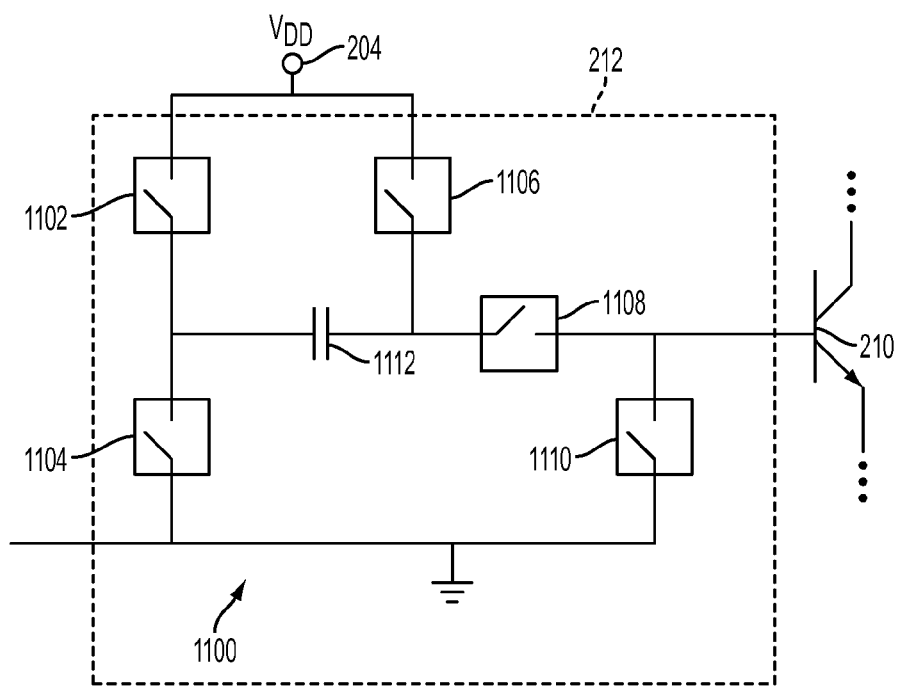
FIG. 11 is a base drive circuit having a current-mode charge pump according to one embodiment of the disclosure.

Referring back to FIG. 2, additional configurations of the base drive circuit 212 are shown below in FIGS. 11-12. FIG. 11 is a base drive circuit having a current-mode charge pump according to one embodiment of the disclosure. Charge pump 1100 within a base drive circuit 212 may deliver charge from a supply voltage $V_{DD}$ at input node 204 to the base node of the BJT 210. Charge delivered to the base may be multiplied by a gain of the BJT 210 to provide a net output power from charge pump circuit 1100. In operation of the charge pump circuit 1100, there may be two alternating phases: a charge phase and a dump phase. The two phases may alternate at a high switching frequency (e.g., 20 MHz). In the charge phase, the switches 1104 and 1106 may be closed, and switches 1102, 1108, and 1110 may be open. In the dump phase, switches 1102 and 1108 may be closed, and switches 1104, 1106 and 1110 may be open. The average current delivered by the charge pump 1100 may be calculated as $$C1*fsw*dv,$$

where C1 is the capacitance of capacitor 1112, fsw is the switching frequency for the BJT 210, and dv is a difference between a voltage of capacitor 1112 at the end of the charge phase and a voltage of capacitor 1112 at the end of the dump phase. When no base current is desirable, switch 1110 may be closed to disable the charge pump circuit 1100, and the other switches 1102, 1104, 1106, and 1108 may be left in a stable, non-dissipative condition. For example, switches 1102 and 1108 may be open and switches 1104 and 1106 may be closed.

Figure 12:
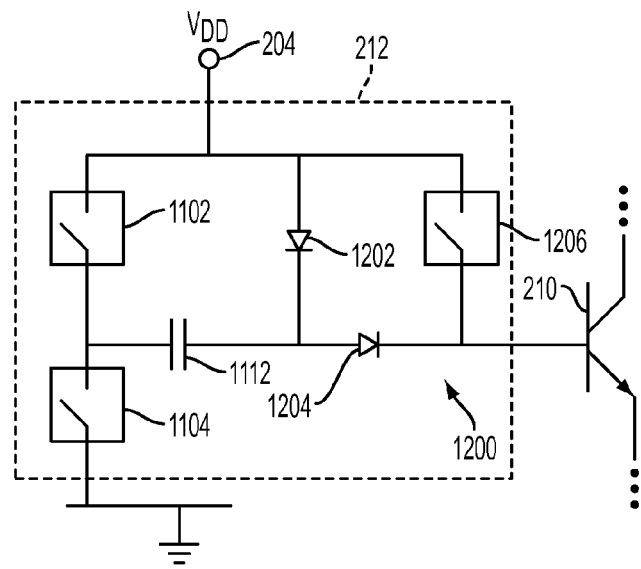
FIG. 12 is a base drive circuit having a current-mode charge pump according to another embodiment of the disclosure.

Another base drive circuit is shown in FIG. 12. FIG. 12 is a base drive circuit having a current-mode charge pump according to another embodiment of the disclosure. The charge pump 1200 of base drive circuit 212 may include the switches 1102 and 1104 and capacitor 1112 of the charge pump 1100. Diodes 1202 and 1204 may replace switches 1106 and 1108 of charge pump 1100. Switch 1206 may allow disabling of the charge pump 1200 by shorting the base-emitter junction of the BJT 210. Capacitor 1112 and switches 1102, 1104, and 1206 may be internal to an IC controller powered by the supply voltage $V_{DD}$. In one embodiment, such an IC controller may include a Zener diode, as illustrated in Zener diode 762 of FIG. 7, coupled between the supply voltage $V_{DD}$ and a ground to allow extra current generated at the input node 204 to be discharged to ground.

Figure 13:
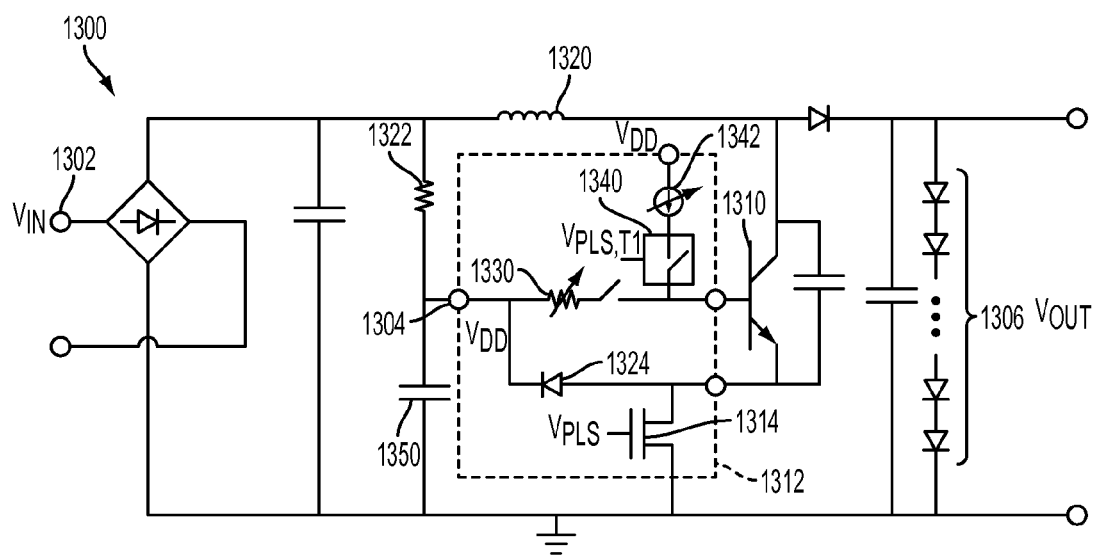
FIG. 13 is a circuit illustrating a BJT-based boost stage topology according to one embodiment of the disclosure.

As described above, a supply voltage $V_{DD}$ may be generated from the emitter of a bipolar junction transistor (BJT). Charge for the supply voltage $V_{DD}$ may also be generated from a reverse recovery time (RRT) of the BJT to harvest energy and charge a capacitor for the supply voltage $V_{DD}$. One circuit for harvesting charge during reverse recovery is shown in FIG. 13. FIG. 13 is a circuit illustrating a BJT-based boost stage topology according to one embodiment of the disclosure. Although a boost stage is illustrated, the charge harvesting during reverse recovery may be applied to other power circuitry.

A circuit 1300 includes a BJT 1310. An input voltage $V_{IN}$, such as a line voltage, may be applied at input node 1302 and passed to a collector node of the BJT 1310 through inductor 1320. A control circuit 1312 may be coupled to the BJT 1310 through a base node and an emitter node of the BJT 1310. The BJT 1310 may be emitter-controlled through switch 1314. Reverse recovery of charge from a base node of the BJT 1310 may be passed through the control circuit 1312 to output node 1304 to charge capacitor 1350 to generate a supply voltage $V_{DD}$.

During a start-up time for the circuit 1300, resistor 1322 may provide charge to the output node 1304 to generate supply voltage $V_{DD}$. After start-up, the BJT 1310 is emitter-controlled to control power delivery to LEDs 1306. The BJT 1310 may be controlled through the switch 1314, which may be a low-voltage field-effect transistor (LV FET) operated from a control signal $V_{PLS}$. During an on phase of the BJT 1310, base current is applied from the control circuit 1312 to the base node of the BJT 1310. The current may be sufficiently high enough to position the operation point of the BJT 1310 on a boundary of saturation and triode operation.

Figure 14:
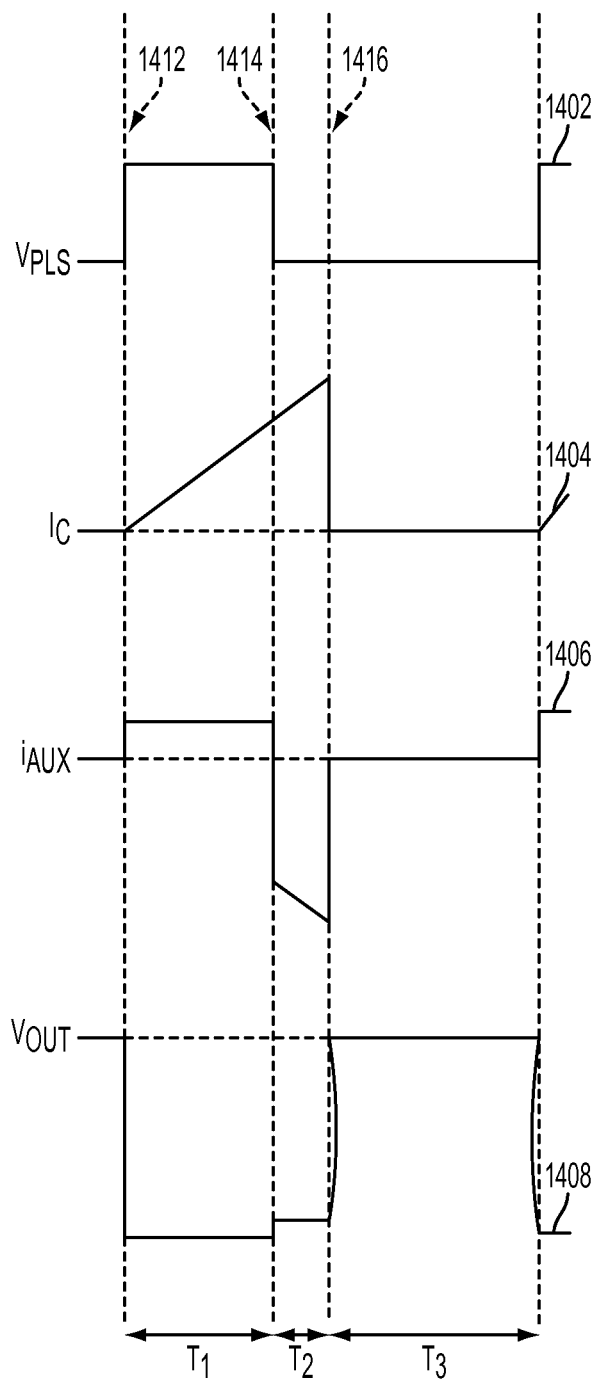
FIG. 14 are graphs illustrating currents and control signals for operating a BJT-based boost stage, such as that of FIG. 13, according to one embodiment of the disclosure.

The on phase is illustrated as time period T1 in FIG. 14. FIG. 14 are graphs illustrating currents and control signals for operating a BJT-based boost stage, such as that of FIG. 13, according to one embodiment of the disclosure. At time 1412, the time period T1 begins when a control signal $V_{PLS}$ applied to the switch 1314 switches high to enable the switch 1314. A collector current $I_C$ may then increase linearly with current through the inductor 1320. Additionally, current may be applied to the base node of the BJT 1310 as shown by a positive $i_{aux}$ current into the base node of the BJT 1310. If the provided base current from $i_{aux}$ is less than a minimum required base current $$\left(I_B < \frac{I_C}{\beta}\right),$$

where $I_B$ is current at base of BJT 1310, $I_C$ is current at collector of BJT 1310, and β is a gain of BJT 1310, the BJT 1310 may enter into the linear region of operation. This may increase current loss in the BJT 1310. If the base current from $i_{aux}$ is more than a minimum required base current $$\left(I_B > \frac{I_C}{\beta}\right),$$

the BJT 1310 may enter into a saturation region of operation. In this operating condition, the current loss in the BJT 1310 may be reduced as compared to the linear region of operation. However, the power dissipation in the BJT 1310 may be higher because the base current may be higher. Thus, the operating point of the BJT 1310 may be selected to be slightly into the saturation region, such that there may be a balance between switching losses of the BJT 1310 and base current dissipation during the on phase.

Referring back to FIG. 14, at time 1414 the control signal $V_{PLS}$ switches to a low signal to turn off the switch 1314 of FIG. 13 and begin time period T2. When the BJT 1310 is in saturation region before time 1414, the BJT 1310 may enter a reverse recovery phase to discharge base charge accumulated during T1 at time 1414. During time period T2, collector current $I_C$ continues to linearly increase because the BJT 1310 is still conducting. The collector current $I_C$ passes through the emitter node of BJT 1310 and through diode 1324 to output node 1304 to charge capacitor 1350 and generate supply voltage $V_{DD}$. A variable resistor 1330, such as a resistive digital-to-analog converter (DAC), of a reverse recovery path from the BJT 1310 may be used to control the reverse recovery period T2. In another embodiment, the variable resistor 1330 may be omitted, and the reverse recovery period T2 controlled by varying a base current applied to the BJT 1310 from current source 1342 during time period T1. However, increasing the base current $I_B$ may result in additional power dissipation during time period T1. The variable resistor 1330 may allow decoupling of a selection of base current for the time period T1 from control of the reverse recovery period T2. Thus, the variable resistor 1330 may allow control of an amount of charge harvested for the supply voltage $V_{DD}$.

At time 1416, a time period T3 begins during which the BJT 1310 turns off resulting in a zero collector current $I_C$ 1404 and a zero auxiliary current $i_{aux}$ 1406. During time period T3, power is delivered from the input node 1302 to LEDs 1306 through the inductor 1320.

Figure 15:
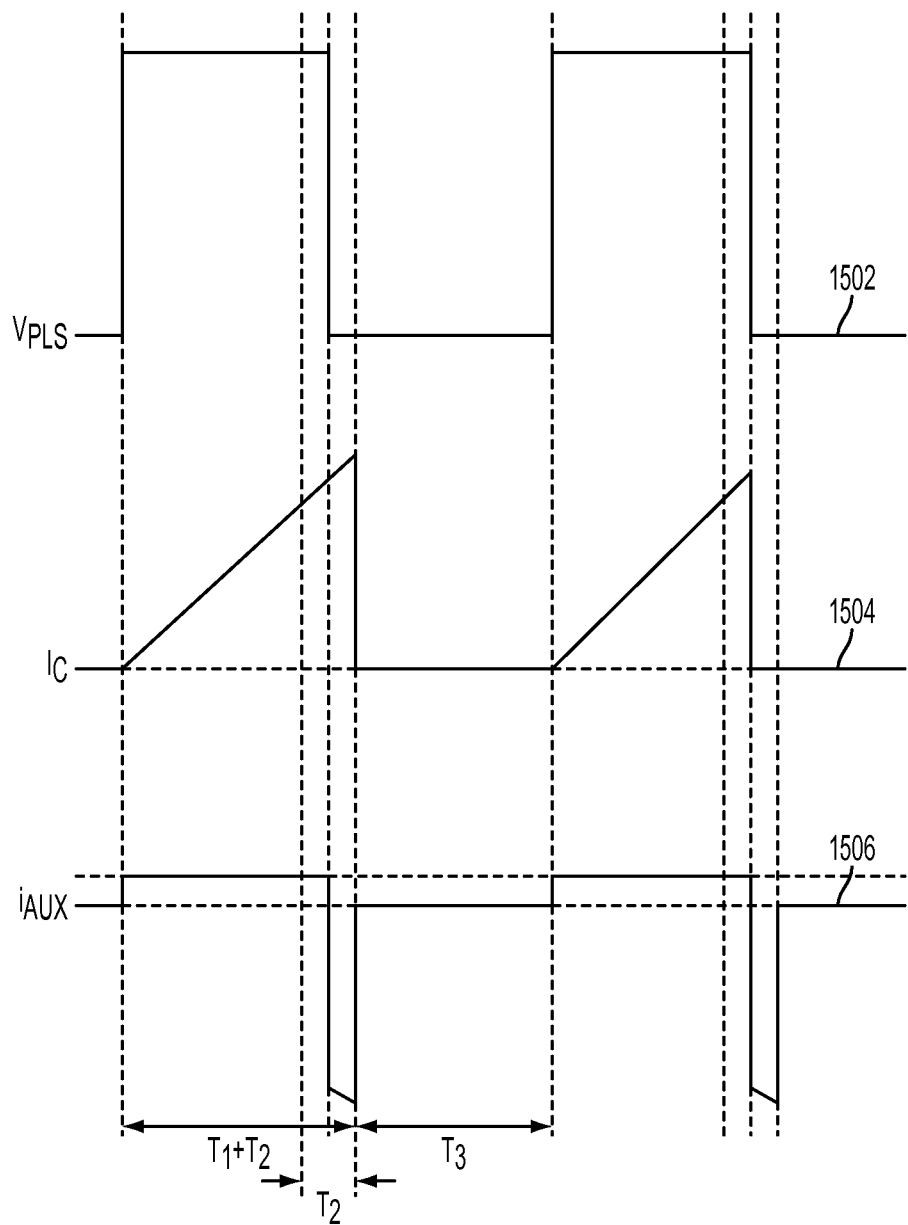
FIG. 15 are graphs illustrating a change in auxiliary current with different resistances in a reverse recovery path according to one embodiment of the disclosure.

The effects of varying the resistor 1330 are illustrated in the graph of FIG. 15. FIG. 15 are graphs illustrating a change in auxiliary current with different resistances in a reverse recovery path according to one embodiment of the disclosure. Varying the resistor 1330 adjusts a duration of T2, but the time period for T1+T2 may remain fixed. By increasing or decreasing the length of time of T2, total charge transferred to the supply voltage $V_{DD}$ during time period T2 may be adjusted. By increasing the resistor 1330, the reverse recovery time may increase. In the embodiment shown, a T1+T2 time is fixed, resulting in an inductor current reaching the same peak regardless of the value of resistor 1330. When the reverse recovery time increases, the amount of energy harvested at the chip supply may increase as shown using the supply current wave, represented by the $i_{aux}$ current wave.

Operation of circuit 1300 of FIG. 13 may be described mathematically as shown below. A current through the inductor 1320 may be given by:

$$\begin{cases} i_L = \frac{V_i}{L} * t & (0 < t < T_1) \quad BJT \text{ and } FET \text{ are on} \\ i_L = \frac{V_i - V_{DD}}{L} * t & (T_1 < t < T_2) \quad BJT \text{ in Reverse Recovery and FET is off}, \\ i_L = \frac{V_i - V_O}{L} * t & (T_2 < t < T_3) \quad BJT \text{ and } FET \text{ are off} \end{cases}$$

where $V_i$ is input voltage $V_{IN}$, L is an inductance value of inductor 1320, and $V_O$ is output voltage $V_{OUT}$.

During the on phase (time period T1), the inductor current $I_C$ may increase linearly when the BJT 1310 and switch 1314 are on. During reverse recovery (time period T2), the voltage across the inductor 1320 may become $V_i - V_{DD}$. During an energy delivery to the load, the voltage across the inductor 1320 may become $V_i - V_O$. For calculating reverse recovery current, several assumptions may be made, including:

1) $V_{in} \gg V_{DD}$; and 2) critical conduction operation mode; and 3) Fixed output power.

Considering the above assumptions, the power output, $P_{out}$, of the inductor 1320 and an average current, $I_{O,AVG}$, to the output node 1304 may be calculated as shown below:

$$P_{out} = V_{out} * I_{O,AVG} = \text{Constant}$$

$$I_{O,AVG} = \frac{I_{Peak} * T_3}{2 * T} = \text{Constant},$$

where T is a time period summed from T1, T2, and T3, and $I_{Peak}$ is a peak current value through the inductor 1320. Based on the assumptions and current through inductor 1320, $I_{Peak}$ may be calculated as:

$$\frac{V_i}{L} * (T_1 + T_2) =$$

$$\frac{V_O - V_i}{L} * T_3 => V_i = \left(1 - \frac{(T_1 + T_2)}{T}\right) * V_O = (1 - DutyCycle) * V_O$$

$$I_{Peak} = \frac{V_i}{L} * (T_1 + T_2),$$

where $V_i$ is the input voltage $V_{IN}$, and L is an inductor value of the inductor 1320. From the above equations a peak current, $I_{Peak}$, may also be represented as:

$$I_{Peak} = \frac{2 * P_{out}}{V_i}.$$

The average reverse recovery current to output node 1304, $I_{VDD,RR}$, may then be calculated as:

$$I_{VDD,RR} = \frac{T_2}{T} * \left[\frac{1}{T_2} \int_{T_1}^{T_1+T_2} \frac{V_i}{L} * t \, \partial t\right] = \frac{V_i}{L} * \frac{2T_2 T_1 + T_2^2}{2T}$$

To harvest energy during reverse recovery for charging the supply voltage $V_{DD}$, a minimum T2 period may be necessary as defined by the following criteria:

$$I_B < \frac{V_i - V_{DD}}{2L} * \left(2T_2 + \frac{T_2^2}{T_1}\right)$$

Figure 16:
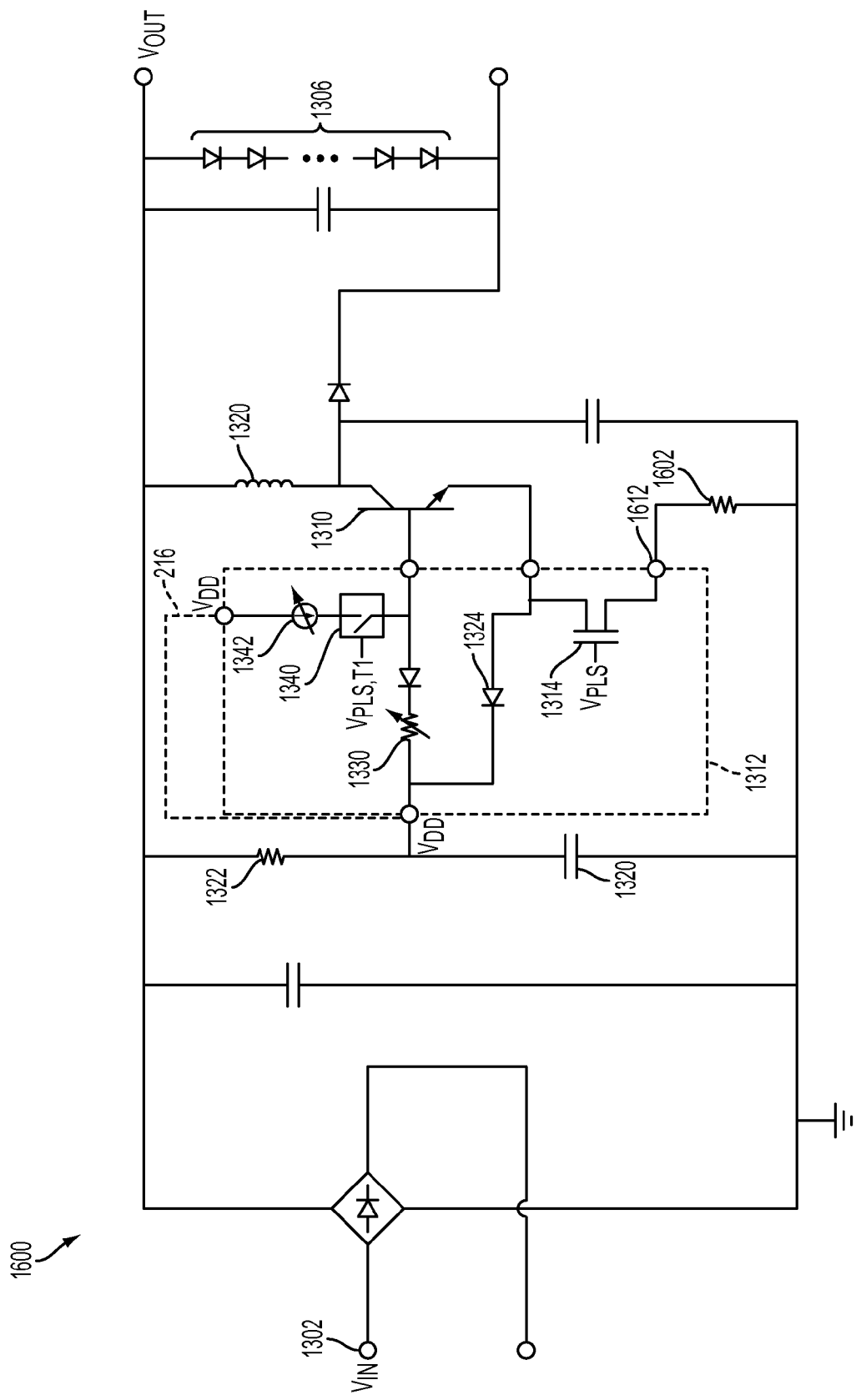
FIG. 16 is a circuit illustrating a BJT-based boost stage topology with emitter voltage sensing according to one embodiment of the disclosure.

The circuit 1300 of FIG. 13 may be modified to allow sensing of the collector current and a calculation of reverse recovery charge. FIG. 16 is a circuit illustrating a BJT-based boost stage topology with emitter voltage sensing according to one embodiment of the disclosure. For example, circuit 1600 of FIG. 16 includes an additional node 1612 for accessing the control circuit 1312. The node 1612 may be coupled to the switch 1314. A resistor 1602 coupled to the node 1612 may set a voltage at node 1612. By monitoring the voltage at node 1612, a collector current $I_C$ may be calculated and the ramp rate determined. From the ramp rate, an auxiliary current $i_{aux}$ may be calculated, based on the equations above, and a controller performing the calculating may then determine a timing interval of operating the $V_{PLS}$ control signal.

Figure 17:
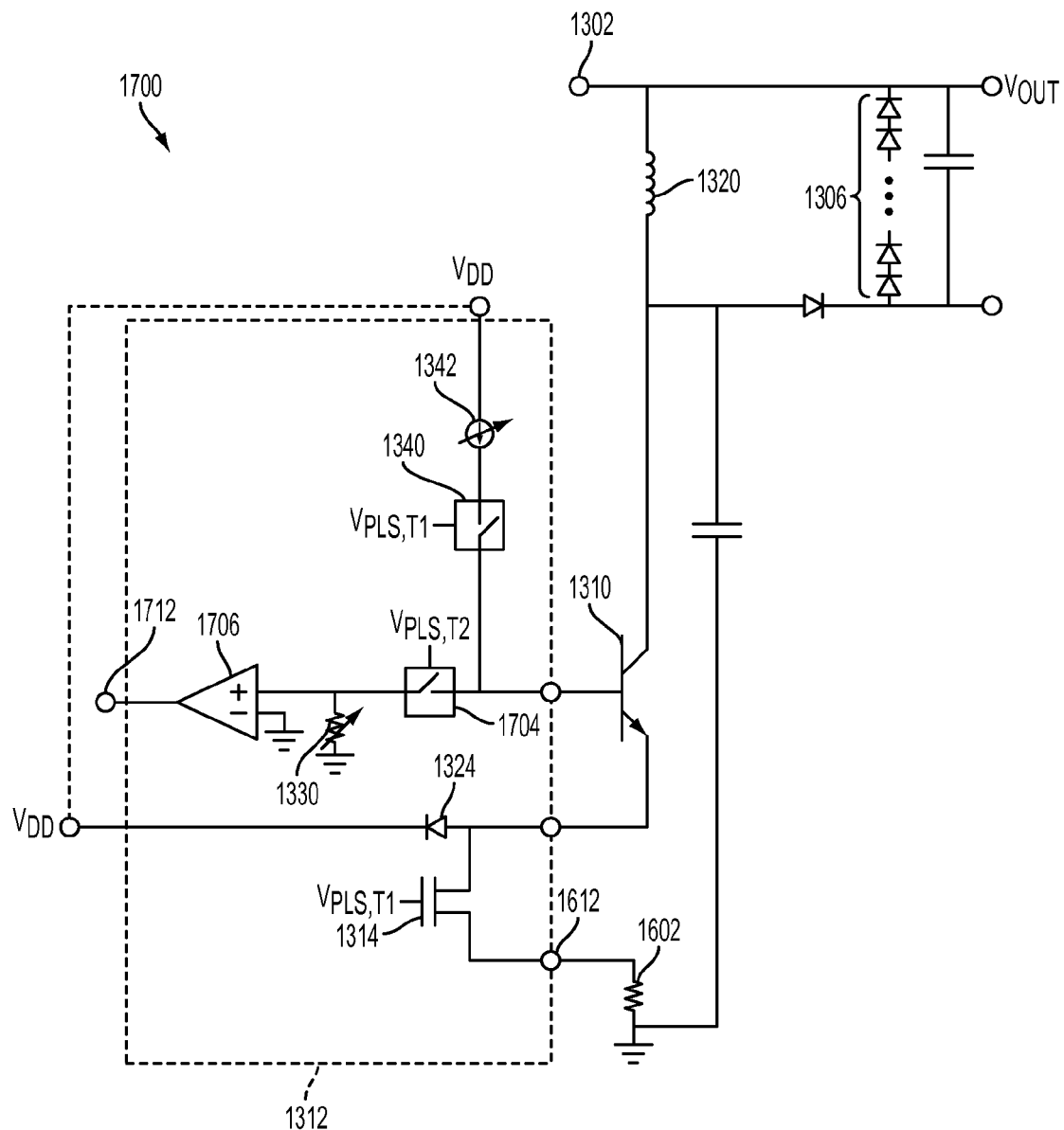
FIG. 17 is a circuit illustrating a BJT-based boost stage topology with turn off detection according to one embodiment of the disclosure.

The circuit 1600 of FIG. 16 may be modified to provide feedback regarding when the BJT 1310 turns off. FIG. 17 is a circuit illustrating a BJT-based boost stage topology with turn-off detection according to one embodiment of the disclosure. A circuit 1700 includes control circuit 1312 coupled to the base and emitter of BJT 1310. Coupled to the base node of the BJT 1310 may be a switch 1704 operated by control signal $V_{PLS,T2}$. The switch 1704 couples the resistor 1330 and a comparator 1706 to the base of the BJT 1310. A switch 1340 couples the current source 1342 to the base node of the BJT 1310 based on a control signal $V_{PLS,T1}$. The current source 1342 may be powered from a supply voltage $V_{DD}$, such as that generated by the circuit 1700 through feedback loop 216. The current source 1342 may be, for example, a charge pump as described above with reference to FIGS. 3-6 and 11-12.

The comparator 1706 may provide detection of when the BJT 1310 turns off. During a first time period, the base node of the BJT 1310 may be charged from current source 1342 when the switch 1340 is closed and the switch 1704 is open. During a reverse recovery period, such as time period T2, the switch 1704 may be closed and the switch 1340 opened to allow reverse current from the base node of the BJT 1310 to pass through the resistor 1330 to ground. The comparator 1706 compares a voltage across the resistor 1330 with a reference voltage, which may be close to the ground level. The voltage across the resistor 1330 will decrease to near ground as the base of the BJT 1310 is nearing complete discharge and the BJT 1310 is nearing turn off. The comparator 1706 may detect this condition and provide an output at node 1712.

A controller IC may receive the output of node 1712 and control the $V_{PLS,T1}$ and $V_{PLS,T2}$ signals and adjust the resistor 1330 to obtain a desired output voltage $V_{DD}$. The resistor 1330 may be increased to increase the duration of T2 but at a decrease of initial inductor peak current, $I_p$, such that the final inductor peak current, $I_{pf}$, remains the same.

Figure 18:
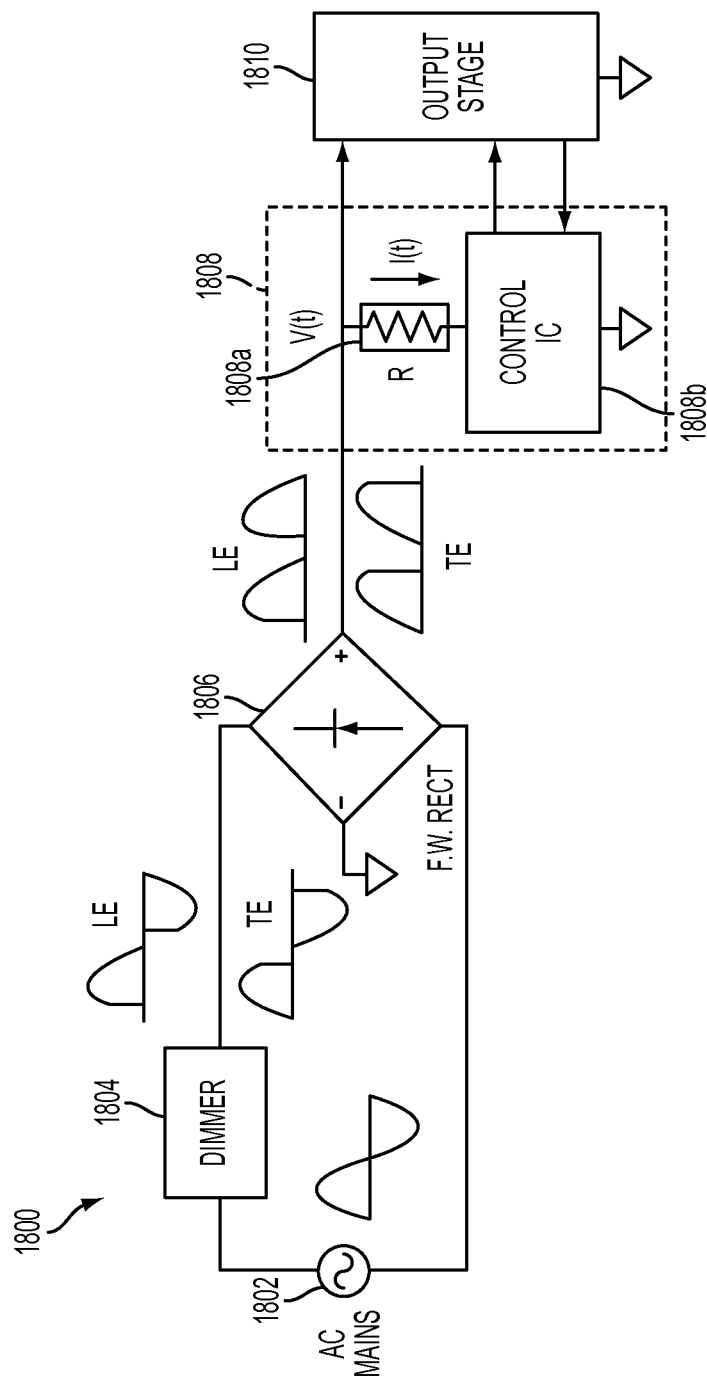
FIG. 18 is a block diagram illustrating a dimmer system with a variable resistance device according to another embodiment of the disclosure.

A complete system illustrating operation of a LED-based light bulb having the functionality described above, including dimmer compatibility, is shown in FIG. 18. FIG. 18 is a block diagram illustrating a dimmer system with a variable resistance device according to another embodiment of the disclosure. A system 1800 may include a dimmer compatibility circuit 1808 with a variable resistance device 1808a and a control integrated circuit (IC) 1808b. The control IC 1808b may include, for example, the transistors and switches disclosed in FIGS. 2-6. In certain embodiments, the transistors and switches disclosed in FIGS. 2-6 may be external to the control IC 1808b. The dimmer compatibility circuit 1808 may couple an input stage having a dimmer 1804 and a rectifier 1806 with an output stage 1810, which may include light emitting diodes (LEDs). The system 1800 may receive an input from an AC mains line 1802.

If implemented in firmware and/or software, the functions described above may be stored as one or more instructions or code on a computer-readable medium. Examples include non-transitory computer-readable media encoded with a data structure and computer-readable media encoded with a computer program. Computer-readable media includes physical computer storage media. A storage medium may be any available medium that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to store desired program code in the form of instructions or data structures and that can be accessed by a computer. Disk and disc includes compact discs (CD), laser discs, optical discs, digital versatile discs (DVD), floppy disks and Blu-ray discs. Generally, disks reproduce data magnetically, and discs reproduce data optically. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and certain representative advantages have been described in detail, it should be understood that various changes, substitutions and alterations can be made herein without departing from the spirit and scope of the disclosure as defined by the appended claims. For example, although signals generated by a controller are described throughout as "high" or "low," the signals may be inverted such that "low" signals turn on a switch and "high" signals turn off a switch. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding embodiments described herein may be utilized. Accordingly, the appended claims are intended to include within their scope such processes, machines, manufacture, compositions of matter, means, methods, or steps.

What is claimed is:

1. An apparatus, comprising:
a bipolar junction transistor (BJT) configured to provide power to a controller powered from a supply voltage, the transistor comprising:
   a collector coupled to a high voltage source;
   an emitter configured to switch between a first output and a second output, wherein when the emitter is coupled to the first output the BJT returns energy to the supply voltage, and wherein the emitter is coupled to the second output the BJT drives current to a ground, and
   wherein the high voltage source comprises a high voltage with respect to the ground, the high voltage being greater in magnitude than the supply voltage with respect to the ground; and
   a base; and
a base drive circuit coupled to the base and configured to:
   receive the supply voltage; and
   generate a current to the base.

2. The apparatus of claim 1, wherein the base drive circuit comprises a charge pump.

3. The apparatus of claim 2, wherein the charge pump comprises:
an inverter comprising:
   a first input coupled to the emitter through a feedback loop to the supply voltage;
   a second input coupled to the ground;
   an output coupled to the base of the BJT; and
   a control signal input coupled to receive an input select signal and configured to receive a square wave at a frequency selected to generate a desired average direct current (DC) voltage at the output of the inverter.

4. The apparatus of claim 1, further comprising:
a first switch coupled to the emitter and the ground and configured to receive a first control signal for coupling the emitter to the ground, and
wherein the base drive circuit comprises:
   a second switch coupled to the base and the supply voltage node and configured to receive a first control signal for coupling the base to a supply voltage node having the supply voltage; and
   a third switch coupled between the emitter and the supply voltage node and configured to receive a second control signal for coupling the emitter to the supply voltage node.

5. The apparatus of claim 4, wherein the controller is configured to generate the first control signal and the second control signal with a switching rate between the first time period and the second time period that is greater than a turn-off time of the bipolar junction transistor (BJT), and
wherein the controller is configured to generate the first control signal and the second control signal such that during a first time period current is driven into the base from the supply voltage node and such that during a second time period current is driven from the collector through the emitter to the supply voltage node.

6. The apparatus of claim 1, further comprising:
a first switch coupled to the emitter and to the ground; and
a resistor coupled to the base and to the supply voltage, and
wherein the BJT is configured to also operate as a charge pump by switching the BJT faster than a response time of the BJT.

7. The apparatus of claim 6, further comprising an inductor coupled between the collector and the high voltage source.

8. The apparatus of claim 6, further comprises:
a second switch coupled to the emitter and coupled to the supply voltage, and
wherein the base drive circuit comprises:
a third switch coupled to the base and to the ground; and
a fourth switch coupled to the base and to the supply voltage.

9. The apparatus of claim 1, wherein the base drive circuit comprises a first switch coupled to the emitter of the bipolar junction transistor (BJT), wherein the first switch is configured to control a reverse recovery phase of the bipolar junction transistor (BJT) to direct current to the ground during a first time period and direct current to the supply voltage during a second time period.

10. The apparatus of claim 9, further comprising:
a switch coupled to the base of the bipolar junction transistor (BJT); and
a variable resistor coupled to the switch,
wherein the variable resistor is configured to control a duration of a reverse recovery time of the bipolar junction transistor (BJT).

11. The apparatus of claim 1, further comprising:
a second bipolar junction transistor (BJT) comprising:
a second base;
a second emitter coupled to the emitter of the bipolar junction transistor (BJT);
a second collector coupled to the high voltage source; and
a second base drive circuit coupled to the second base of the second bipolar junction transistor (BJT) and coupled to the supply voltage,
wherein the bipolar junction transistor (BJT) is configured to generate the power supply voltage for the second base drive circuit.

12. The apparatus of claim 1, wherein the controller comprises a lighting controller configured to operate a plurality of light emitting diodes (LEDs), wherein the high voltage source is a line voltage source.

13. The apparatus of claim 12, wherein the lighting controller and the bipolar junction transistor (BJT) are integrated into an integrated circuit (IC).

14. The apparatus of claim 1, further comprising:
one or more charge switches coupled to a base of the bipolar junction transistor (BJT), the one or more charge switches configured to control current flow to the base;
one or more disable switches coupled to the base, the switches configured to stop current flow to the base; and
one or more delivery switches coupled to the emitter, the switches configured to deliver the control voltage to the controller.

15. A method, comprising:
receiving, at a collector of a bipolar junction transistor (BJT), a high voltage from a high voltage source;
driving, from an emitter of the bipolar junction transistor (BJT) in a first mode, current to a supply voltage node from the high voltage source to generate a power supply voltage, and driving, from an emitter of the BJT in a second mode, current to a ground, wherein the high voltage is high with respect to ground, the high voltage being greater in magnitude than the supply voltage with respect to the ground; and
generating, in a base drive circuit, a current to the base.

16. The method of claim 15, further comprising:
charging a junction capacitance of the transistor by closing a transistor charge switch coupled to a base-emitter junction of the transistor at a first time;
delivering current from the emitter to the charge voltage by opening the transistor charge and closing a delivery switch at a second time;
repeating the charging and delivering at a frequency greater than a turn-off time of the transistor.

17. The method of claim 15, wherein the base drive circuit comprises a charge pump.

18. The method of claim 17, wherein generating the increased voltage comprises driving an inverter with a square wave to output the supply voltage to a capacitor coupled to the base of the BJT, wherein the square wave has a frequency higher than a response time of the BJT.

19. The method of claim 15, further comprising:
receiving, at a first switch of the base drive circuit, a first control signal for coupling the emitter to the ground;
receiving, at a second switch of the base drive circuit coupled to the base and the supply voltage, a second control signal for coupling the base to the supply voltage; and
receiving, at a third switch coupled between the emitter and the supply voltage, a second control signal for coupling the emitter to the supply voltage,
wherein the first control signal and the second control signal are received such that during a first time period current is driven into the base from the supply voltage and such that during a second time period current is driven from the collector through the emitter to the supply voltage node.

20. The method of claim 19, wherein the first control signal and the second control signal have a switching rate between the first time period and the second time period that is greater than a turn-off time of the bipolar junction transistor (BJT).

21. The method of claim 15, further comprising:
operating, by the controller, a first switch coupled to the emitter and to the ground; and
disconnecting the emitter and the ground to increase the power supply voltage
wherein the base drive circuit comprises a resistor coupled to the base and to the supply voltage.

22. The method of claim 21, wherein receiving the high voltage comprises receiving the high voltage from an inductor.

23. The method of claim 21, further comprising
operating, by the controller, the first switch, a second switch coupled to the emitter and coupled to the supply voltage, a third switch coupled to the base and to the ground, and a fourth switch coupled to the base and to the supply voltage; and
regulating the power supply voltage by adjusting timing of at least one of the first switch, the second switch, the third switch, and the fourth switch.

24. The method of claim 15, further comprising:
controlling a reverse recovery phase of the bipolar junction transistor (BJT).

25. The method of claim 24, wherein controlling the reverse recovery phase comprises:
adjusting, by the controller, a variable resistor coupled to a switch coupled to the base of the bipolar junction transistor (BJT).

26. The method of claim 15, further comprising providing power to light emitting diodes (LEDs).

27. The method of claim 15, further comprising:
controlling current flow to a base of the bipolar junction transistor (BJT) by operating one or more charge switches coupled to the base;
stopping current flow to the base by operating one or more disable switches coupled to the base; and
delivering the control voltage to the controller by operating one or more delivery switches coupled to the emitter.

28. A system, comprising:
one or more light emitting diodes (LEDs);
a line voltage input node configured to receive a high voltage;
a controller coupled to the light emitting diodes (LEDs) and configured to regulate energy transfer from the line voltage input node to the one or more light emitting diodes (LEDs), the controller being powered by a power supply voltage;
a bipolar junction transistor (BJT) configured to provide power to the controller, the transistor comprising:
a collector coupled to the line voltage input node;
an emitter configured to switch between a first output and a second output, wherein when the emitter is coupled to the first output the BJT returns energy to a supply voltage to produce the power supply voltage, and wherein when the emitter is coupled to the second output the BJT drives current to the ground,
wherein the high voltage is high with respect to the ground, the high voltage being greater in magnitude than the supply voltage with respect to the ground; and
a base; and
a base drive circuit coupled to the base and configured to:
receive the power supply voltage; and
generate a current to the base.

29. The system of claim 28, further comprising:
one or more charge switches coupled to a base of the bipolar junction transistor (BJT), the one or more charge switches configured to control current flow to the base;
one or more disable switches coupled to the base, the switches configured to stop current flow to the base; and
one or more delivery switches coupled to the emitter, the switches configured to deliver the control voltage to the controller.

* * * * *